US011133799B2

(12) United States Patent
Buttolo et al.

(10) Patent No.: US 11,133,799 B2
(45) Date of Patent: Sep. 28, 2021

(54) CAPACITIVE PROXIMITY SENSOR ASSEMBLY HAVING MULTIPLE SENSING CONFIGURATIONS

(71) Applicant: Ford Global Technologies, LLC, Dearborn, MI (US)

(72) Inventors: Pietro Buttolo, Dearborn Heights, MI (US); Stuart C. Salter, White Lake, MI (US); James Robert Chascsa, II, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 41 days.

(21) Appl. No.: 16/689,596

(22) Filed: Nov. 20, 2019

(65) Prior Publication Data

US 2021/0152175 A1 May 20, 2021

(51) Int. Cl.
*H03K 17/955* (2006.01)

(52) U.S. Cl.
CPC . *H03K 17/955* (2013.01); *H03K 2217/94052* (2013.01)

(58) Field of Classification Search
CPC .................. H03K 17/955; H03K 2217/94052
See application file for complete search history.

(56) References Cited

U.S. PATENT DOCUMENTS

| 8,933,708 | B2 | 1/2015 | Buttolo et al. |
| 9,568,527 | B2 | 2/2017 | Buttolo et al. |
| 10,027,322 | B2* | 7/2018 | Jiao .................. H03K 17/955 |
| 2011/0057899 | A1* | 3/2011 | Sleeman .............. G06F 3/0445 |
| | | | 345/174 |
| 2011/0073384 | A1* | 3/2011 | Osoinach ............ G06F 3/04166 |
| | | | 178/18.06 |
| 2012/0013354 | A1* | 1/2012 | Bowler ................ G01N 27/226 |
| | | | 324/664 |
| 2013/0018489 | A1* | 1/2013 | Grunthaner ........ G06F 3/04142 |
| | | | 700/73 |
| 2013/0041244 | A1* | 2/2013 | Woias .................. A61B 5/0215 |
| | | | 600/381 |
| 2014/0174204 | A1* | 6/2014 | Chen ...................... G01L 1/142 |
| | | | 73/862.626 |
| 2015/0346132 | A1* | 12/2015 | Morosow ............. G01N 27/223 |
| | | | 73/335.04 |
| 2017/0336242 | A1* | 11/2017 | Thibault .............. G01D 5/2412 |
| 2018/0062649 | A1 | 3/2018 | Salter et al. |
| 2018/0356455 | A1* | 12/2018 | Rice ......................... G06F 9/24 |

FOREIGN PATENT DOCUMENTS

DE        102014117823 A1    6/2016

* cited by examiner

*Primary Examiner* — Dominic E Hawkins
(74) *Attorney, Agent, or Firm* — David Coppiellie; Price Heneveld LLP

(57) ABSTRACT

A capacitive proximity sensor assembly is provided that includes a first electrode, a second electrode, a first compliant dielectric layer disposed between the first and second electrodes, and a controller processing signals associated with the first and second electrodes and selectively reconfiguring operation of the first and second electrodes in different proximity sensor arrangements to provide a plurality of capacitive sensors. The capacitive proximity assembly may be selectively reconfigured into up to four capacitive sensors.

20 Claims, 20 Drawing Sheets

CAPACITIVE PROXIMITY SENSOR ASSEMBLY HAVING MULTIPLE SENSING CONFIGURATIONS

FIELD OF THE INVENTION

The present invention generally relates to proximity sensors, and more particularly relates to a capacitive proximity sensor assembly having multiple electrodes configurable for multiple sensing arrangements.

BACKGROUND OF THE INVENTION

Proximity sensors and switches, such as capacitive sensors and switches, have been employed for use on vehicles for operating devices such as interior map and dome lighting, moonroofs, and various other devices. Capacitive switches typically employ capacitive sensors to generate a sense activation electric field and sense changes to the activation electric field indicative of an object such as due to a user's finger in close proximity or contact with the sensor. Capacitive sensors are typically configured to include one or two electrodes configured with electrical circuitry. It would be desirable to provide for enhanced sensor configurations.

SUMMARY OF THE INVENTION

According to a first aspect of the present invention, a capacitive proximity sensor assembly is provided. The proximity sensor assembly includes a first electrode, a second electrode, a first compliant dielectric layer disposed between the first and second electrodes, and a controller processing signals associated with the first and second electrodes and selectively reconfiguring operation of the first and second electrodes in different proximity sensor arrangements to provide a plurality of capacitive sensors.

Embodiments of the first aspect of the invention can include any one or a combination of the following features:
  the first electrode comprises a pair of electrodes that are configurable to generate a mutual capacitance to provide a first capacitive sensor and are further configurable to generate a self-capacitance to provide a second capacitive sensor;
  the pair of electrodes comprises a first plurality of capacitive fingers and a second plurality of electrode fingers, wherein the first plurality of electrode fingers are interdigitated with the second plurality of electrode fingers;
  the first and second electrodes provide a third capacitive sensor;
  the capacitive proximity sensor assembly including a third electrode, and a second compliant dielectric layer disposed between the second electrode and the third electrode, wherein the second and third electrodes provide a fourth capacitive sensor;
  the controller sequentially samples signals associated with each of the first, second, third and fourth capacitive sensors;
  the pair of electrodes are shorted together and move towards the second electrode when the first compliant dielectric is compressed with force so as to form a pressure sensor;
  the assembly is located on a vehicle; and
  the proximity sensor assembly is located on a steering wheel of the vehicle.

According to a second aspect of the present invention, a capacitive proximity sensor assembly is provided. The capacitive proximity sensor assembly includes first and second electrodes having first and second fingers configurable to form a mutual capacitance, a third electrode, a first compliant dielectric layer disposed between the first and second electrodes and the third electrode, a fourth electrode, a second compliant dielectric layer disposed between the third and fourth electrodes, and a controller processing signals associated with the first, second, third and fourth electrodes and selectively reconfiguring operation of the first, second, third and fourth electrodes in different proximity sensor arrangements to provide a plurality of capacitive sensors.

Embodiments of the second aspect of the invention can include any one or a combination of the following features:
  The first electrode comprises a first plurality of capacitive fingers and the second electrode comprises a second plurality of electrode fingers, wherein the first plurality of electrode fingers are interdigitated with the second plurality of electrode fingers;
  the first and second electrodes are configurable to generate a mutual capacitance to provide a first capacitive sensor and are further configurable to generate a self-capacitance to provide a second capacitive sensor;
  the first and second electrodes are shorted together and move towards the third electrode when the compliant first dielectric is compressed so as to form a third capacitive sensor that senses pressure;
  the third and fourth electrodes provide a fourth capacitive sensor, and wherein the controller sequentially samples signals associated with each of the first, second, third and fourth capacitance sensors;
  the assembly is located on a vehicle; and
  the proximity sensor assembly is located on a steering wheel of the vehicle.

According to a third aspect of the present invention, a capacitive proximity sensor assembly is provided. The capacitive proximity sensor assembly includes first and second electrodes configurable to form a mutual capacitance, a third electrode, a first compliant dielectric disposed between both of the first and second electrodes and the third electrode, and a controller selectively processing signals associated with the first, second, and third electrodes and selectively reconfiguring operation of the first, second and third electrodes in different proximity sensor arrangements to provide a plurality of capacitive sensors.

Embodiments of the third aspect of the invention can include any one or a combination of the following features:
  the first electrode comprises a first plurality of capacitive fingers and the second electrode comprises a second plurality of electrode fingers, wherein the first plurality of electrode fingers are interdigitated with the second plurality of electrode fingers;
  further includes a fourth electrode, and a second compliant dielectric disposed between the third and fourth electrodes; and
  the assembly is located on a vehicle.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
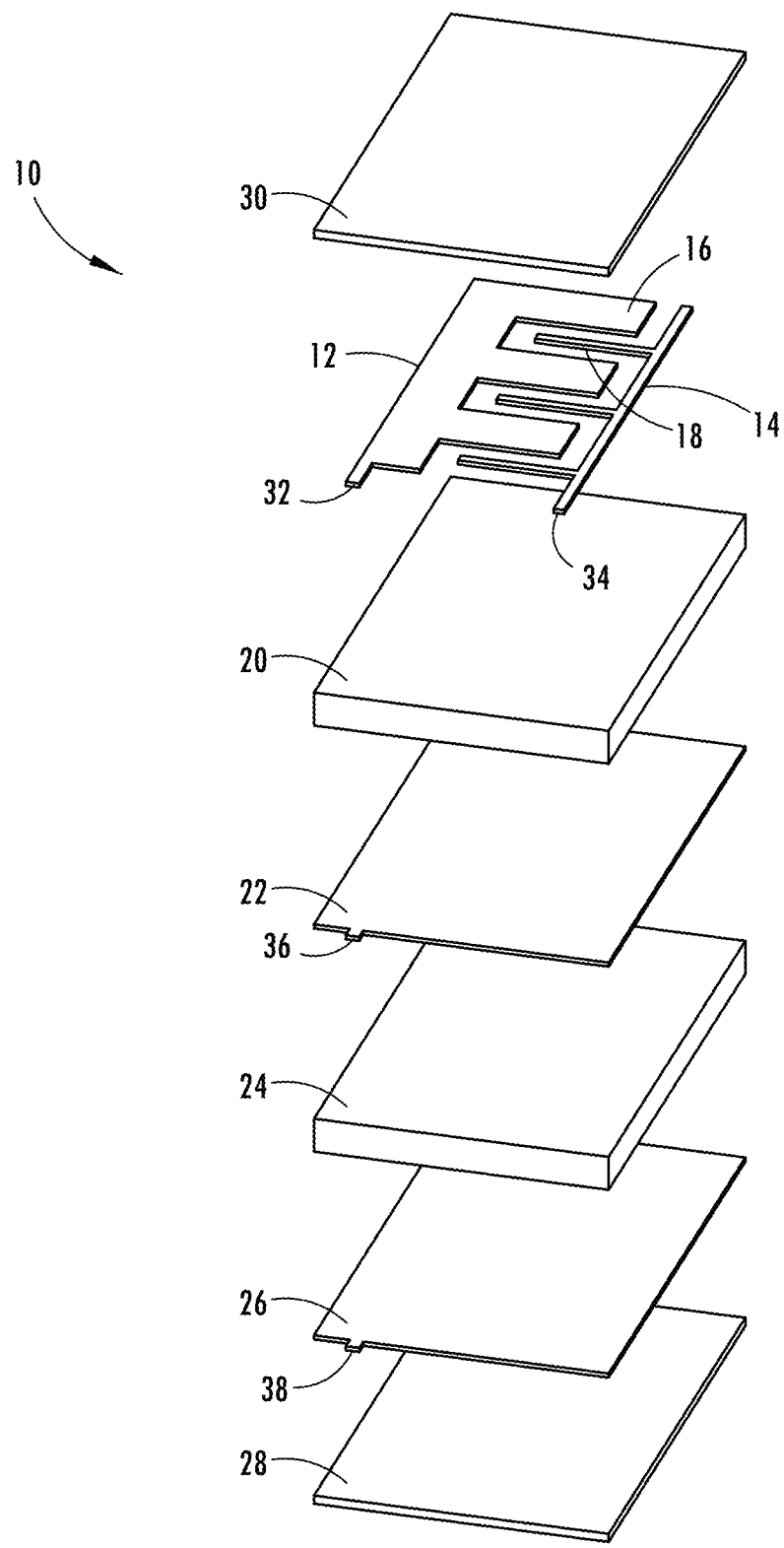
FIG. 1 is an exploded upper front perspective view of a capacitive proximity sensor assembly, according to a first embodiment.
Figure 18:
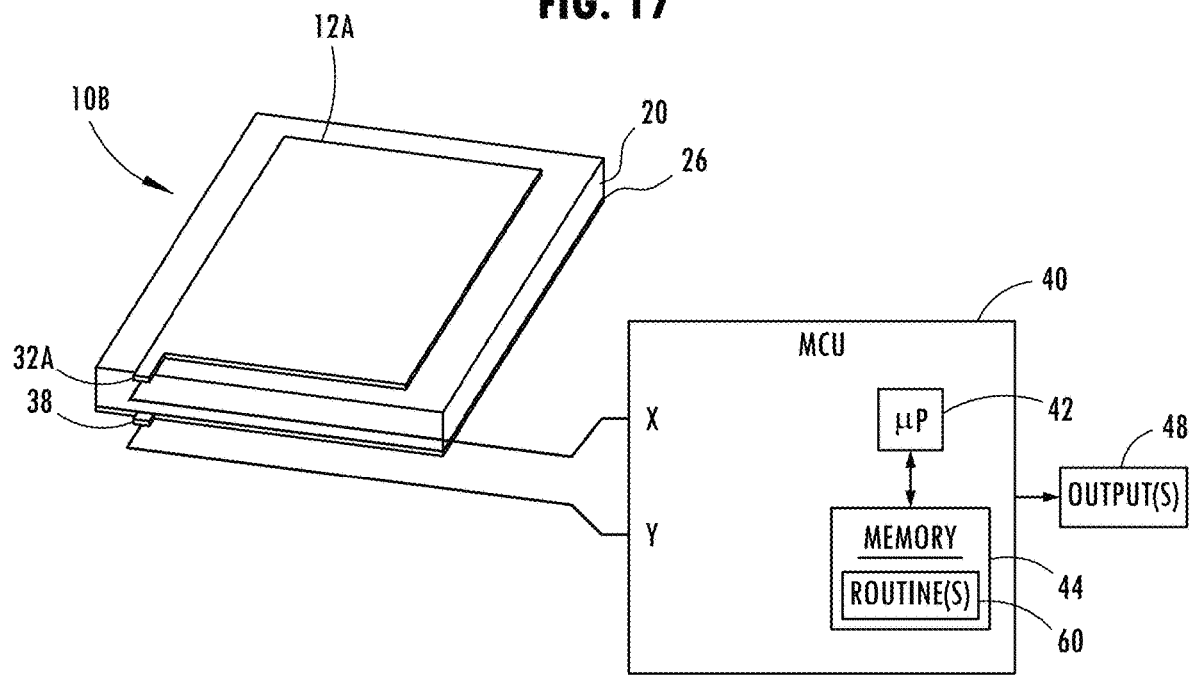
FIG. 18 is a front perspective view of the capacitive proximity sensor assembly shown in FIG. 16 and configured with a controller to sample signals in a second sensor mode.
Figure 19:
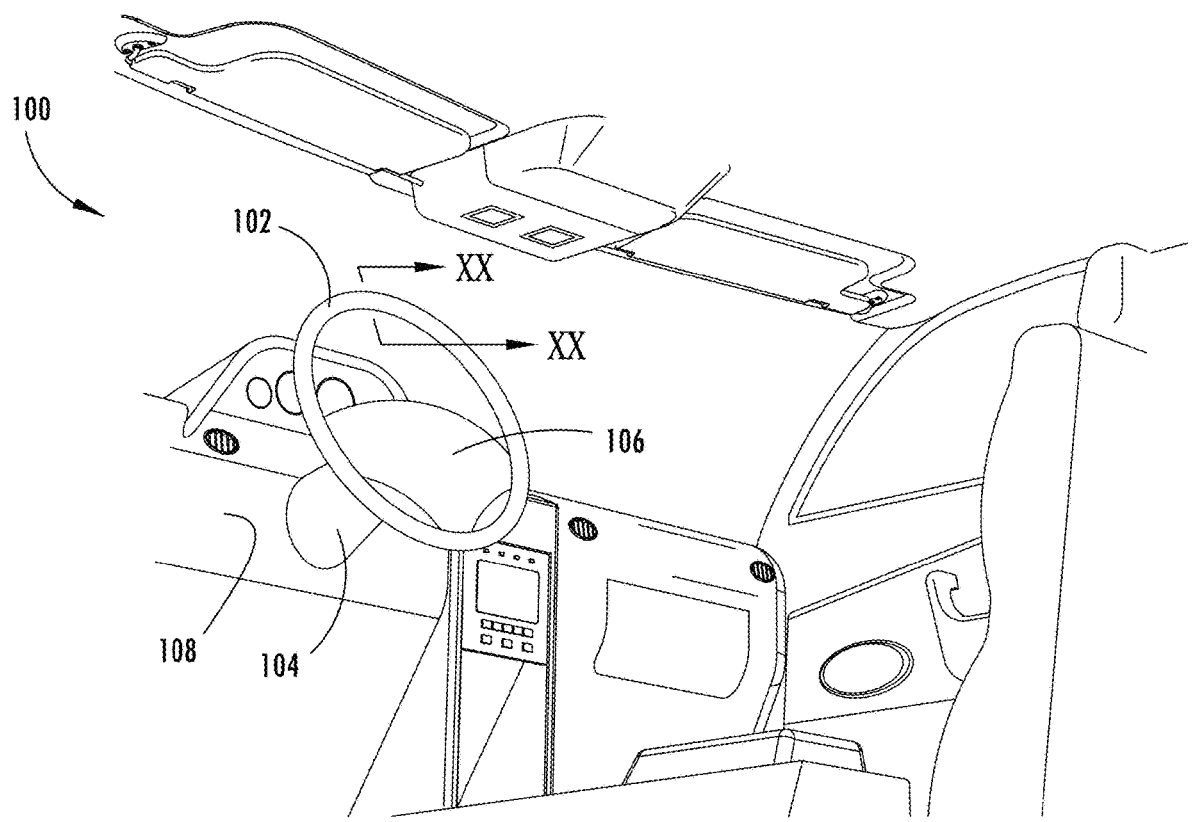
FIG. 19 is a front perspective view of the interior of an automotive vehicle showing a steering wheel having a capacitive proximity sensor assembly, according to the first embodiment.
Figure 20:
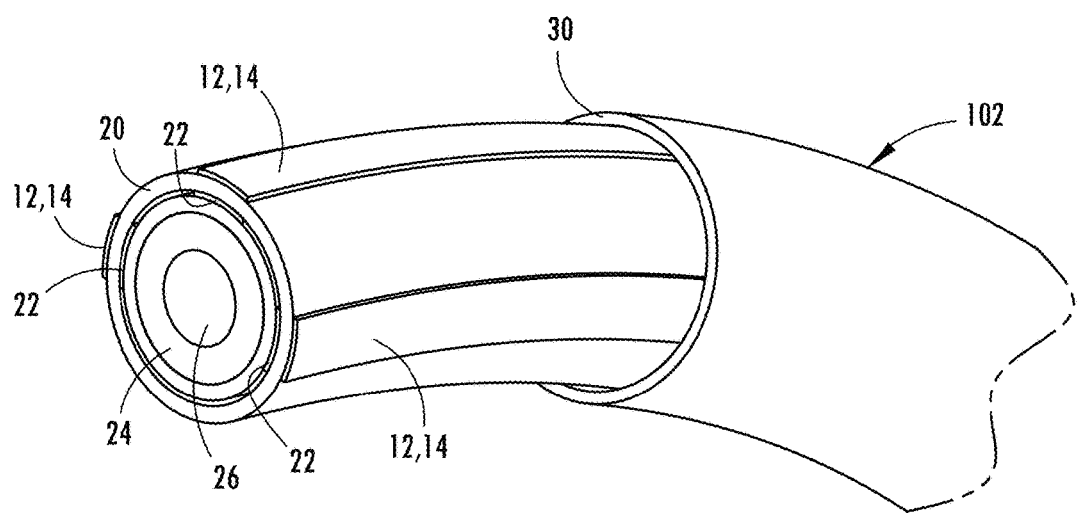
FIG. 20 is a cross-sectional view of the steering wheel taken through lines XX-XX of FIG. 19.

For purposes of description herein, the terms "upper," "lower," "right," "left," "rear," "front," "vertical," "horizontal," and derivatives thereof shall relate to the concepts as oriented in FIGS. 1 and 18. However, it is to be understood that the concepts may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The present illustrated embodiments reside primarily in combinations of method steps and apparatus components related to a restraint monitoring system. Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, like numerals in the description and drawings represent like elements.

As used herein, the term "and/or," when used in a list of two or more items, means that any one of the listed items can be employed by itself, or any combination of two or more of the listed items, can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

Referring now to FIGS. 1-9, a proximity sensor assembly in the form of a capacitive sensor assembly 10 is illustrated, according to a first embodiment. The capacitive proximity sensor assembly 10 includes a pair of first and second electrodes 12 and 14 having respective first and second conductive fingers 16 and 18 configurable in one operating mode to produce mutual capacitance to form a mutual capacitance sensor. The capacitive sensor assembly 10 also includes a third electrode 22 and a compliant first dielectric layer 20 disposed between the pair of first and second electrodes 12 and 14 and the third electrode 22. The capacitive proximity sensor assembly 10 also includes a fourth electrode 26 and a compliant second dielectric layer 24 disposed between the third and fourth electrodes 22 and 26. The capacitive proximity sensor assembly 10 further includes a controller selectively sampling signals from the first, second, third and fourth electrodes and sequentially reconfiguring the operational sensor mode of the electrodes in different proximity sensor operating arrangements or modes to provide a plurality of capacitive sensors that may operate as mutual or self-capacitive sensors.

The capacitive proximity sensor assembly 10, according to the first embodiment shown in FIG. 1, includes four electrodes configured to operate in different sensor modes or states by using a controller to reconfigure the input and output sampling of the signals generated by the various electrodes to operate in different sensor configurations to provide up to four capacitive sensors that may operate as a mutual capacitive sensor or a self-capacitive sensor and to sense input commands, such as touch, proximity and pressure or force.

The arrangement of the electrodes in the capacitive proximity sensor assembly 10 is illustrated in FIG. 1 having the first and second capacitive electrodes 12 and 14 arranged within a common plane or layer and dielectrically isolated from one another via a separation distance. The first electrode 12 has a first plurality of conductive fingers 16 and the second electrode 14 has a second plurality of conductive fingers 18. The first plurality of conductive fingers 16 are interdigitated or interleaved with the second plurality of conductive fingers 18. As a result, the first and second electrodes 12 and 14 may operate in a first mode as a mutual capacitance sensor when one of the electrode signal terminals 32 and 34 is driven with a drive signal and the other of the electrode signal terminals 32 and 34 generates a receive signal when operated in a mutual capacitance mode. When one of the electrode signal terminals 32 and 34 receives a drive signal, that electrode operates as a drive electrode and the other electrode operates as a receive electrode. The drive electrode may receive square wave drive pulses applied at a voltage $V_I$. The receive electrode may have an output for generating an output voltage $V_O$. It should be appreciated that the first and second electrodes 12 and 14 may be arranged in various other configurations for generating a capacitive electric field as an activation field.

In the mutual capacitance sensor mode, the drive electrode is applied with voltage input $V_I$ as square wave pulses having a charge pulse cycle sufficient to charge the receive electrode to a desired voltage. The receive electrode thereby serves as a measurement electrode. When a user or operator, such as a user's finger, enters the activation electric field generally proximate the top front side of the proximity sensor assembly 10, the proximity sensor assembly 10 detects the disturbance caused by the finger to the activation electric field and determines whether the disturbance is sufficient to detect an object such as a touch input sufficient to activate a proximity switch or generate a desired output. The disturbance of the activation electric field is detected by processing the charge pulse signal associated with the corresponding signal.

An overlying dielectric cover 30 is provided on the top front side of the first and second electrodes 12 and 14 to provide dielectric isolation and protection of the first and second electrodes 12 and 14. The dielectric cover 30 may include any dielectric materials, such as a dielectric polymer or plastic, leather, wood or other dielectric medium. It should be appreciated that the first and second electrodes 12 and 14 may be formed by printing conductive ink in the desired patterns of the electrodes. The ink may be printed on the rear surface of the dielectric cover 30, according to one embodiment or may be printed on the front surface of the dielectric layer 20 therebelow. The first and second electrodes 12 and 14 may otherwise be formed by placing preformed conductive electrodes between the dielectric cover 30 and the first compliant dielectric layer 20.

Disposed below the first and second electrodes 12 and 14 is the first compliant dielectric layer 20. The first compliant dielectric layer 20 has a relatively soft material that is compliant and deformable when pressure, which is force applied over an area, is applied to the front of the cover 30 so as to squeeze and deform the first compliant dielectric layer 20. According to one example, the first compliant dielectric layer 20 may be a soft foam material.

Located below the first compliant dielectric layer 30 is a third electrode 22. The third electrode 22 is shown formed as a sheet of conductive material, according to one embodiment. The third electrode 22 has a signal terminal 36 to allow for communication of signals with the controller. The third electrode 22 may operate in one sensor mode as a mutual capacitive sensor that detects pressure applied to the top front surface which causes deformation of the first compliant dielectric layer 20. As the first compliant dielectric layer 20 is squeezed and deforms, at least a portion of the pair of the first and second electrodes 12 and 14, which may be shorted together to form a single electrode or operated individually, moves towards the third electrode 22. When this occurs, the controller detects the relative position of the pair of first and second electrodes 12 and 14 relative to the third electrode 22. In other sensor modes, the third electrode 22 may be open circuited to operate as a shield for the first and second electrodes 12 and 14 located thereabove or the third electrode 22 located therebelow. When operated as a shield, the third electrode 22 may be open circuited such that there is no applied voltage applied or may be driven to a desired voltage, according to various embodiments.

Disposed below the third electrode 22 is the second compliant dielectric layer 24. The second compliant dielectric layer 24 is less compliant than the first dielectric layer 20. According to one example, the second compliant dielectric layer 24 may be made of polyurethane. As such, when force or pressure is applied to the front surface of cover 30, the first compliant dielectric layer 20 will compress first and, when fully compressed, the second compliant dielectric layer 24 will compress thereafter. The second compliant dielectric layer 24 has a compressibility greater than the compressibility of the first compliant dielectric layer 20. In one example, the first compliant dielectric layer 20 may be ten times more compressible than the second compliant dielectric layer 24. It should be appreciated that the third electrode 22 may be formed from a printed conductive ink that may be printed onto the top front surface of the second compliant dielectric layer 24 or onto the bottom rear surface of the first compliant dielectric layer 20. According to other embodiments, the third electrode 22 may be a preformed sheet of conductive material inserted between the first and second compliant dielectric layers 20 and 24.

The fourth electrode 26 is shown located below or rearward of the second compliant dielectric layer 24 and having a conductive signal terminal 38 for communicating with the controller. The fourth electrode 26 may include a core material made of magnesium, according to one example. It should be appreciated that other conductive materials may form the fourth electrode 26 including printed ink or preformed conductive materials. The fourth electrode 26 may be grounded to operate as a ground layer in certain sensor modes, or may operate as a shield in certain sensor modes or may operate to form a mutual capacitance sensor with the third electrode 22 in a further sensor mode. When operating as a mutual capacitance sensor, the third electrode 22 and fourth electrode 26 operate to detect a force or pressure applied to the top front surface of cover 30 that squeezes the second compliant dielectric layer 24 such that at least a portion of the third electrode 22 moves towards the fourth electrode 26. As such, pressure or force may be sensed by detecting movement of the pair of at least a portion of the first and second electrodes 12 and 14 towards the third electrode 22 due to a first pressure or force and further may detect movement of the third electrode 22 relative to the fourth electrode 26 due to a greater amount of pressure or force.

A further bottom dielectric layer 28 is shown provided below the fourth electrode 26 so as to dielectrically isolate the fourth electrode 26 on the bottom side. In one embodiment, the bottom dielectric 28 may be the same material as the second compliant dielectric layer where the various layers are wrapped around an object or folded about a core forming the fourth electrode 26, such as when used on a vehicle steering wheel, for example.

Referring to FIGS. 2-9, the various operating sensor modes of the electrode configurations as controlled by the controller 40 are illustrated for the first embodiment of the capacitive proximity sensor assembly 10. As best seen in FIGS. 2-5, the controller 40 may include a microprocessor 42 and memory 44 configured with one or more routines. The controller 40 may be a micro control unit (MCU) having firmware, according to one example. It should be appreciated that other analog and/or digital circuitry may be used to provide the controller 40. The controller 40 includes various inputs/outputs including four inputs/outputs connected to the respective signal terminals 32, 34, 36 and 38 associated with the first, second, third and fourth electrodes 12, 14, 22 and 26. Additionally, the controller 40 may generate one or more outputs 48 based on the sensed signals. For example, the controller 40 may provide proximity switch outputs based on the proximity sensing such that the capacitive proximity sensor assembly 10 operates as one or more capacitive proximity switches, according to various examples.

Figure 2:
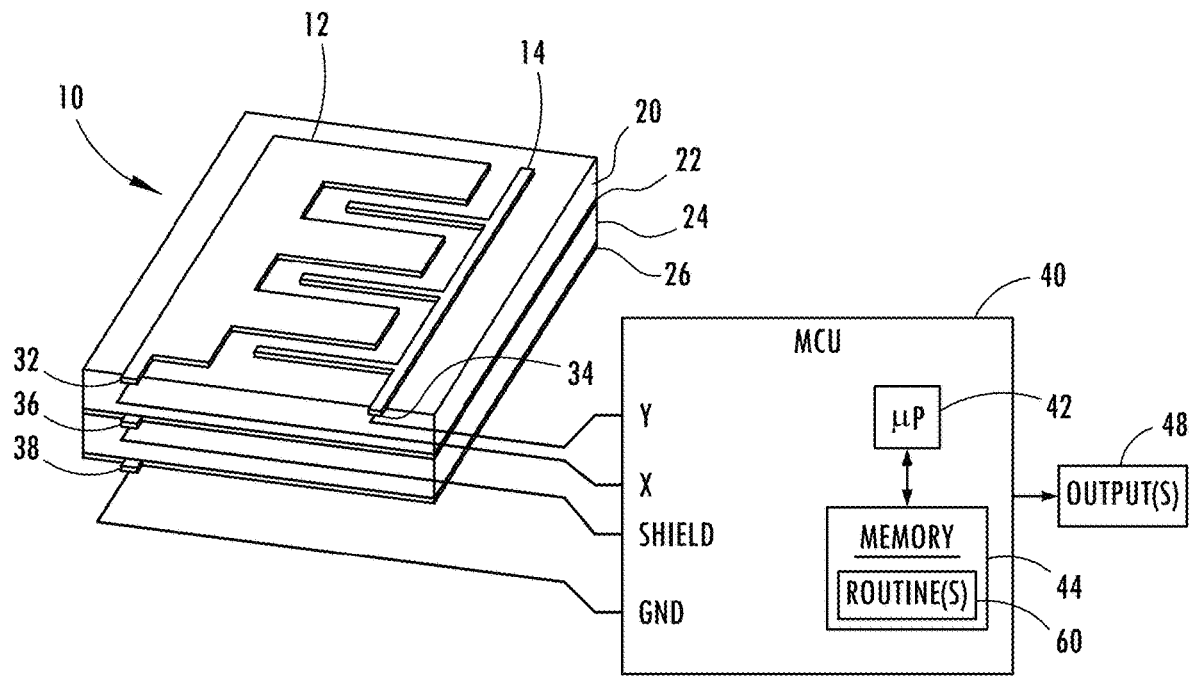
FIG. 2 is a front perspective view of the capacitive proximity sensor assembly shown in FIG. 1 and configured to sample signals in a first sensor mode with a controller.
Figure 6:
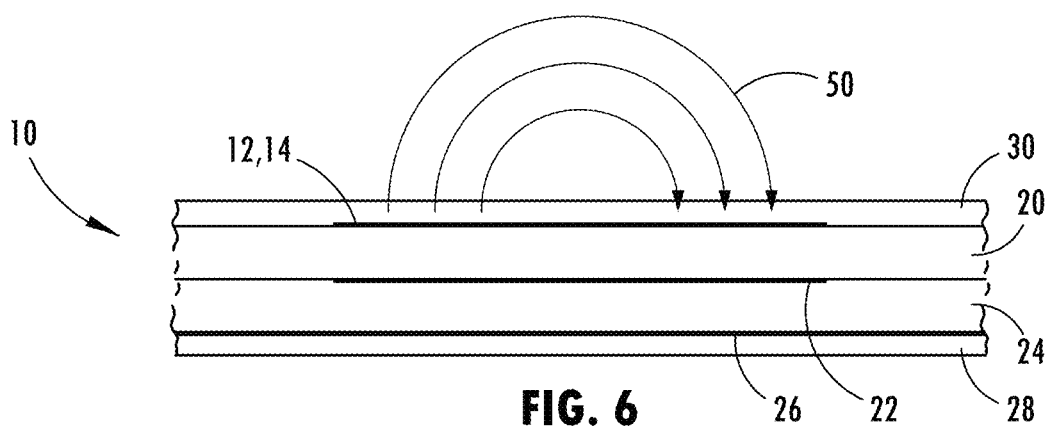
FIG. 6 is a cross-sectional view of the capacitive proximity sensor assembly of FIG. 1 further illustrating the electric field generated in the first sensor mode.

Referring to FIGS. 2 and 6, the proximity sensor assembly 10 is configured according to a first sensor mode in which the first and second electrodes 12 and 14 form a mutual capacitance with each other to serve as a first sensor that may be used to sense touch or close proximity of a user at or near the top front surface of cover 30. In this sensor mode, the fourth electrode 26 is grounded via the controller 40 and the third electrode 22 is open-circuited via the controller 40 so as to form a conductive shield that may enhance the mutual capacitance between the first electrode 12 and second electrode 14. The first electrode 12 may receive a drive signal X and the second electrode 14 may supply a receive signal Y. As seen in FIG. 6, the activation electric field is generated due to a mutual capacitive coupling of the first and second electrodes 12 and 14 as illustrated by arrows 50 to enable the detection of touch or movement, e.g., swipe, on or above the front cover 30 (e.g., within 30 millimeters).

Figure 3:
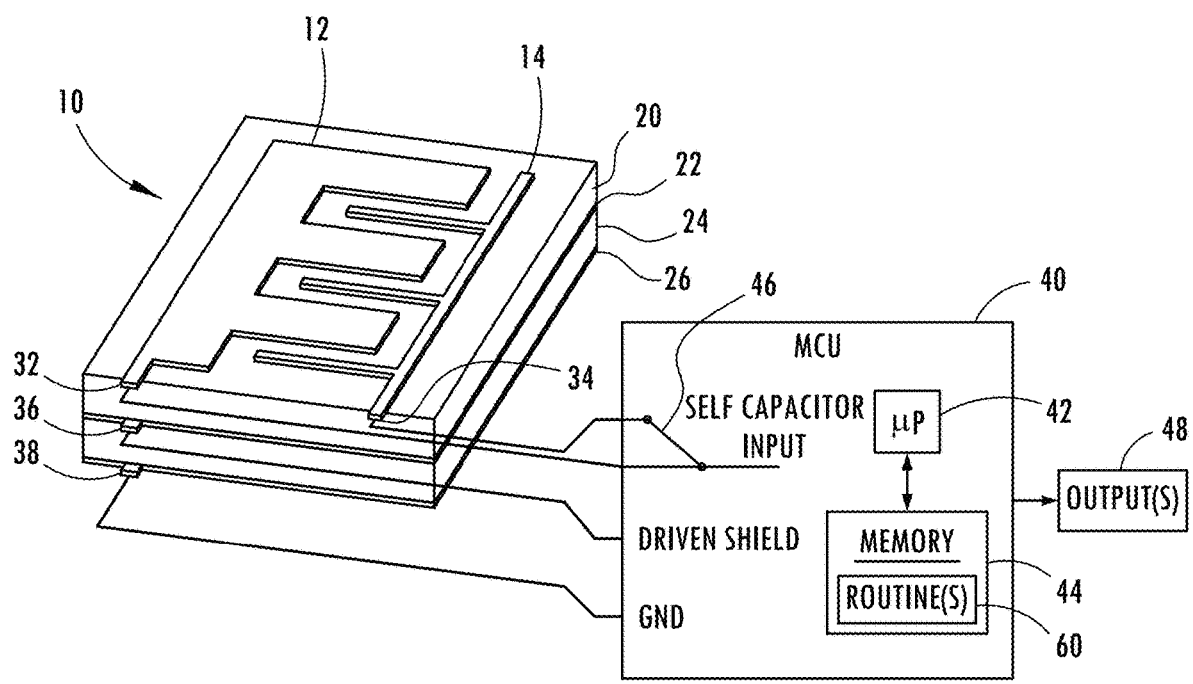
FIG. 3 is a front perspective view of the capacitive proximity sensor assembly shown in FIG. 1 with the controller configured to sample signals in a second sensor mode.
Figure 7:
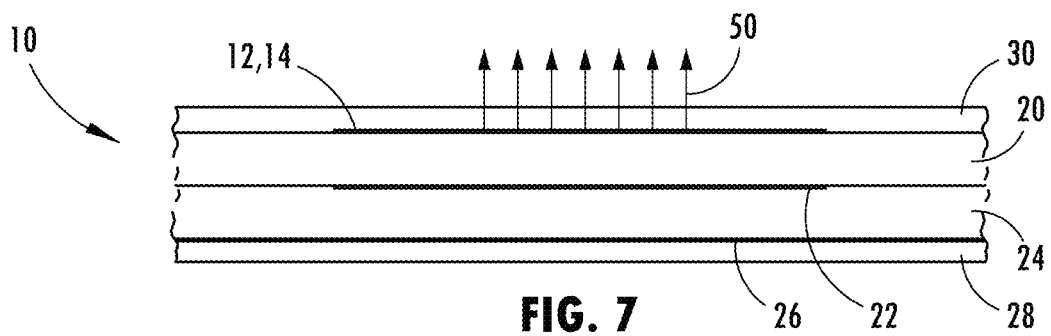
FIG. 7 is a cross-sectional view of the capacitive proximity sensor assembly of FIG. 1 further illustrating the electric field generated in the second sensor mode.

The controller 40 may sequentially switch the capacitive proximity sensor assembly 10 amongst the various sensor modes at a rapid speed simply by changing the inputs and outputs and thereby reconfiguring the sensing arrangement to sequentially provide first, second, third and fourth sensors. Referring to FIGS. 3 and 7, the capacitive proximity sensor assembly 10 is shown in the second sensor mode in which the first and second electrodes 12 and 14 are electrically shorted together to form a single electrode, the third electrode 22 is driven to a desired voltage to provide a shield, and the fourth electrode 26 is grounded. To electrically short the first and second electrodes 12 and 14 together, the controller 40 may include a switch 46 that may be implemented in firmware or otherwise implemented with an analog or digital switch. In this sensor mode, the first and second electrodes 12 and 14 which are shorted together receives a self-capacitor input to generate an activation electric field illustrated by arrows 50 to form a self-capacitive second sensor as seen in FIG. 7 in which the activation electric signal may detect objects above the top front cover 30 at an extended distance (e.g., a distance up to 30 centimeters). The self-capacitor input may apply a voltage for half of a cycle to charge the electrode and may sense capacitance during the other half of the cycle.

Figure 4:
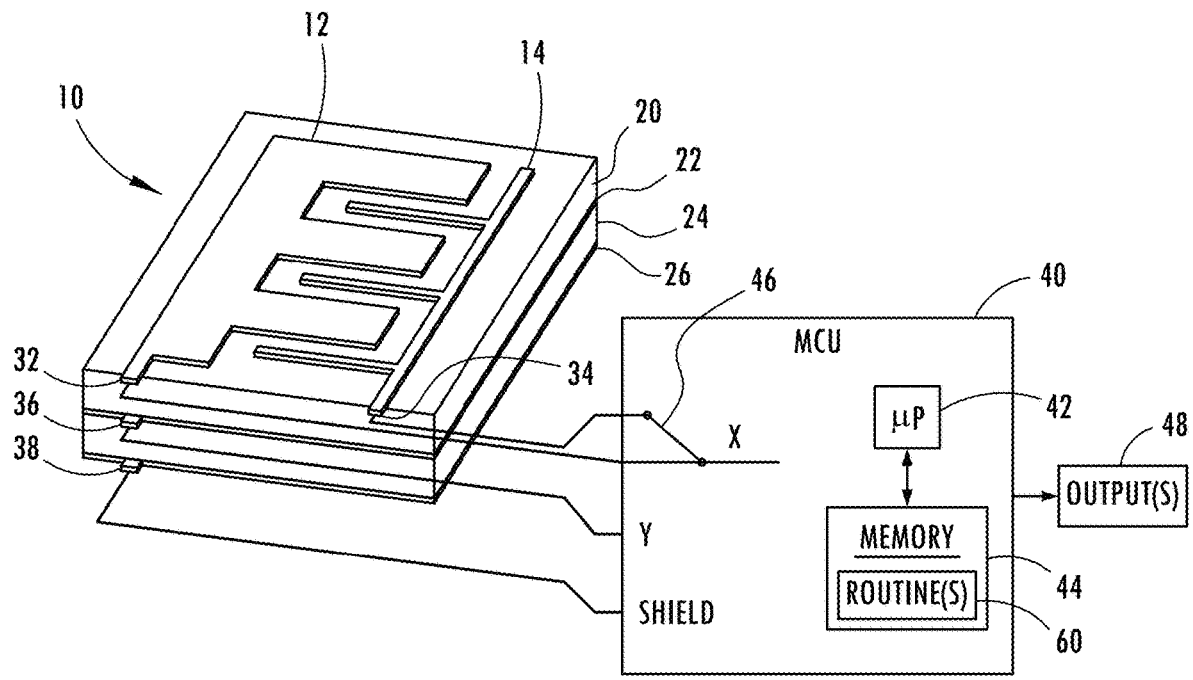
FIG. 4 is a front perspective view of the capacitive proximity sensor assembly shown in FIG. 1 with the controller configured to sample signals in a third sensor mode.
Figure 8:
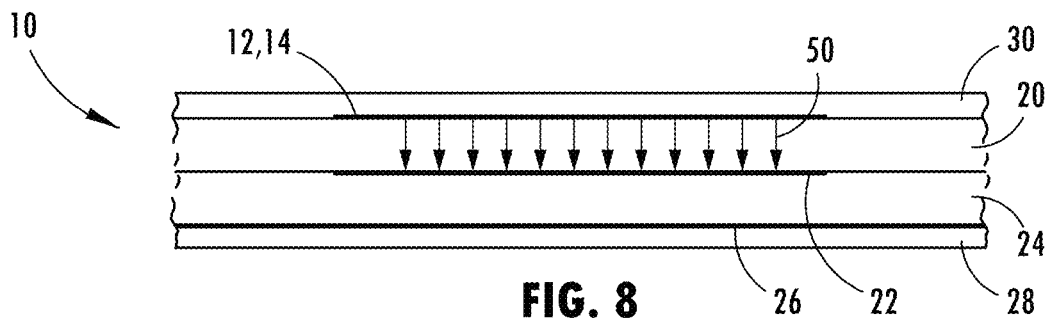
FIG. 8 is a cross-sectional view of the capacitive proximity sensor assembly of FIG. 1 further illustrating the electric field generated in the third sensor mode.

Referring to FIGS. 4 and 8, the capacitive proximity sensor assembly 10 is illustrated in the third sensor mode in which the first and second electrodes 12 and 14 are electrically shorted together via the switch 46 as controlled by controller 40 and receive the drive signal X, the third electrode 22 supplies the receive signal Y and the fourth electrode 26 is open circuited to act as a conductive shield. It should be appreciated that the short circuited first and second electrodes 12 and 14 may receive the drive signal X to form a mutual capacitance with the third electrode 22 to provide a third sensor. As such, movement of the shorted together first and second electrodes 12 and 14 relative to third electrode due to compression of the first compliant dielectric layer 20 may be detected as an indication of the amount of force or pressure applied to the front surface of the cover 30. The activation electric field between the shorted circuited first and second electrodes 12 and 14 and the third electrode 22 is illustrated by arrows 50 in FIG. 8.

Figure 5:
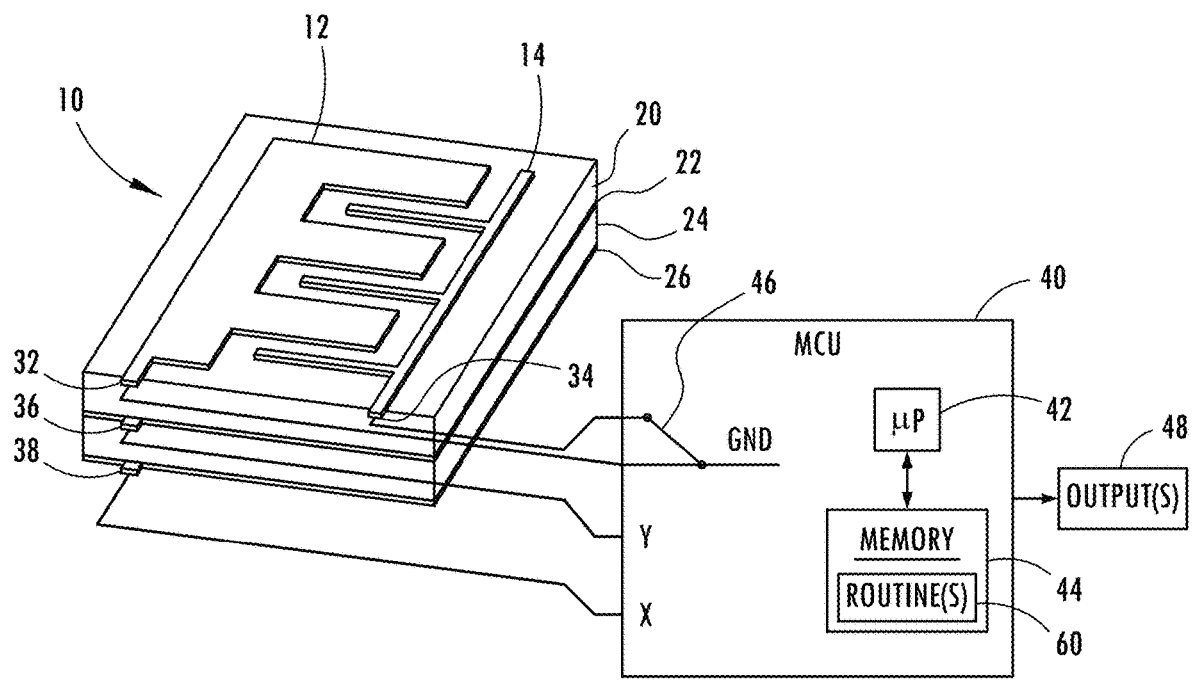
FIG. 5 is a front perspective view of the capacitive proximity sensor assembly shown in FIG. 1 with the controller configured to sample signals in a fourth sensor mode.
Figure 9:
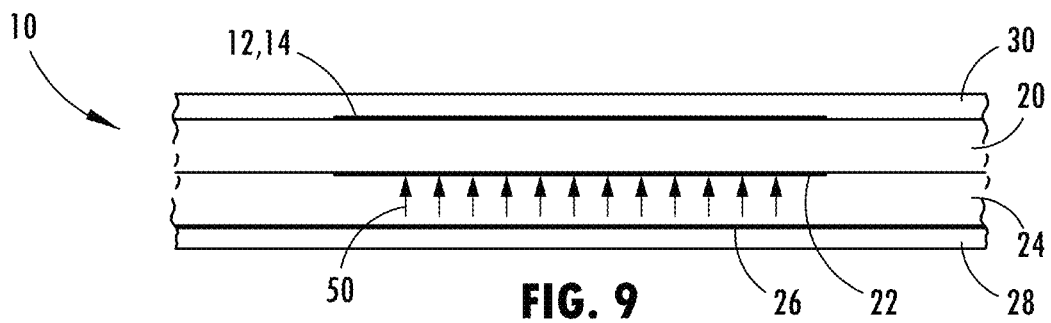
FIG. 9 is a cross-sectional view of the capacitive proximity sensor assembly of FIG. 1 further illustrating the electric field generated in the fourth sensor mode.

Referring to FIGS. 5 and 9, the capacitive proximity sensor assembly 10 is illustrated in the fourth sensor mode in which the first and second electrodes 12 and 14 are electrically shorted together via switch 46 and grounded, and the drive signal X is applied to the fourth electrode 26 and the receive signal Y is received by the third electrode 22. The arrangement forms a mutual capacitive fourth sensor. In this sensor mode, movement of the third electrode 22 relative to the fourth electrode 26 is detected as the second compliant dielectric layer 24 is compressed due to force or pressure applied to the top front surface of the cover 30 so as to detect the amount of force or pressure applied thereto. The activation electric field is shown by arrows 50 in FIG. 9.

Accordingly, it should be appreciated that the controller 40 may sequentially switch between the first, second, third and fourth sensor modes as illustrated in FIGS. 2-9 at a rapid pace so as to sequentially configure the capacitive proximity sensor assembly 10 in various sensor configurations referred to as first, second, third and fourth sensors and sample sensed signals to sense a sensed condition in each sensor mode. This may be achieved by the controller 40 switching the drive signal X and the receive signal Y between the various inputs and outputs and sampling the signals over a short period of time such as 20 milliseconds and then switching sequentially to the next sensor mode, repeatedly. As such, multiple sensors may be realized with the capacitive proximity sensor assembly 10.

Figure 10A:
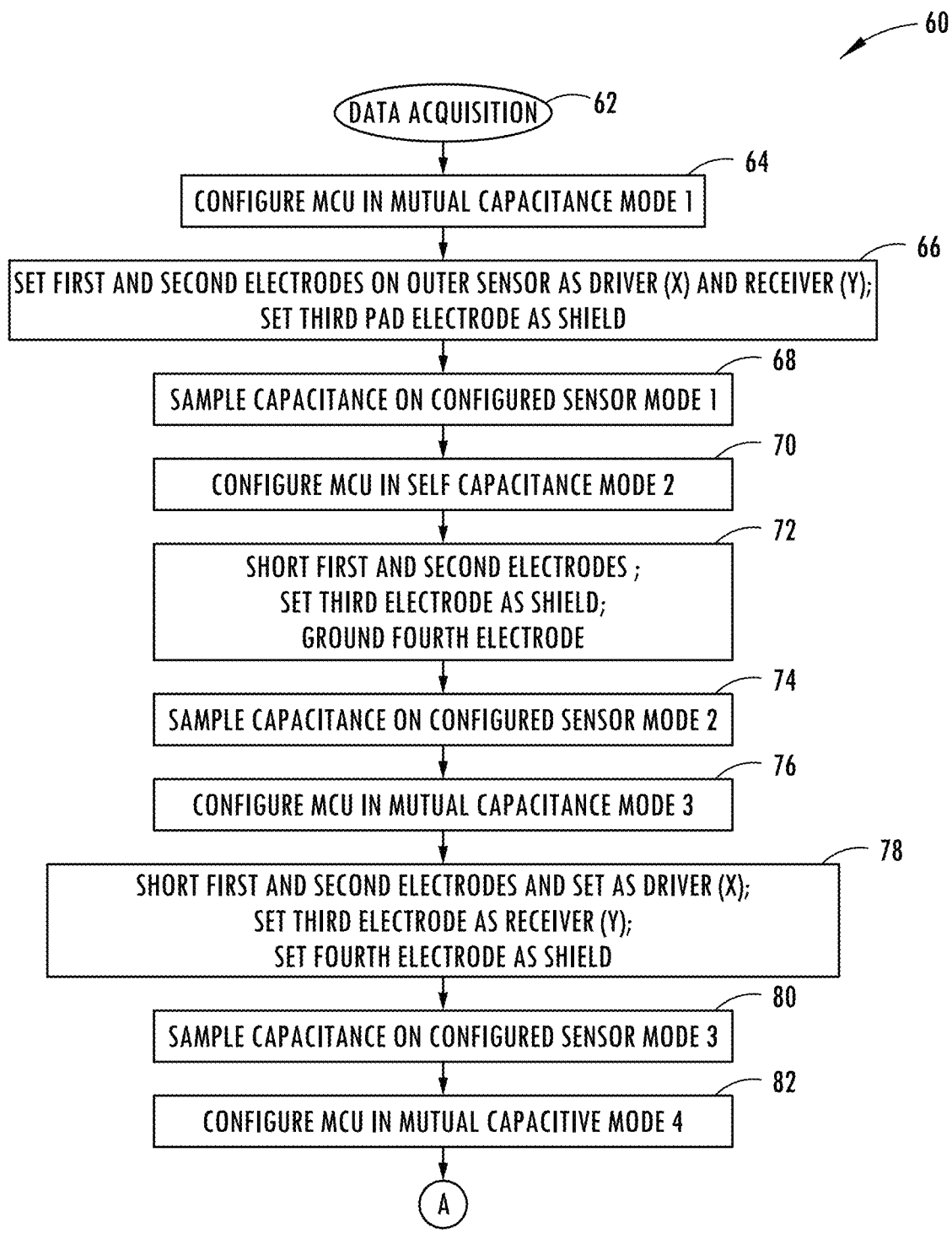
FIGS. 10A-10B is a flow diagram illustrating a routine for sampling and measuring signals generated by the capacitive proximity sensor assembly of FIG. 1 in the first, second, third and fourth sensor modes.
Figure 10B:
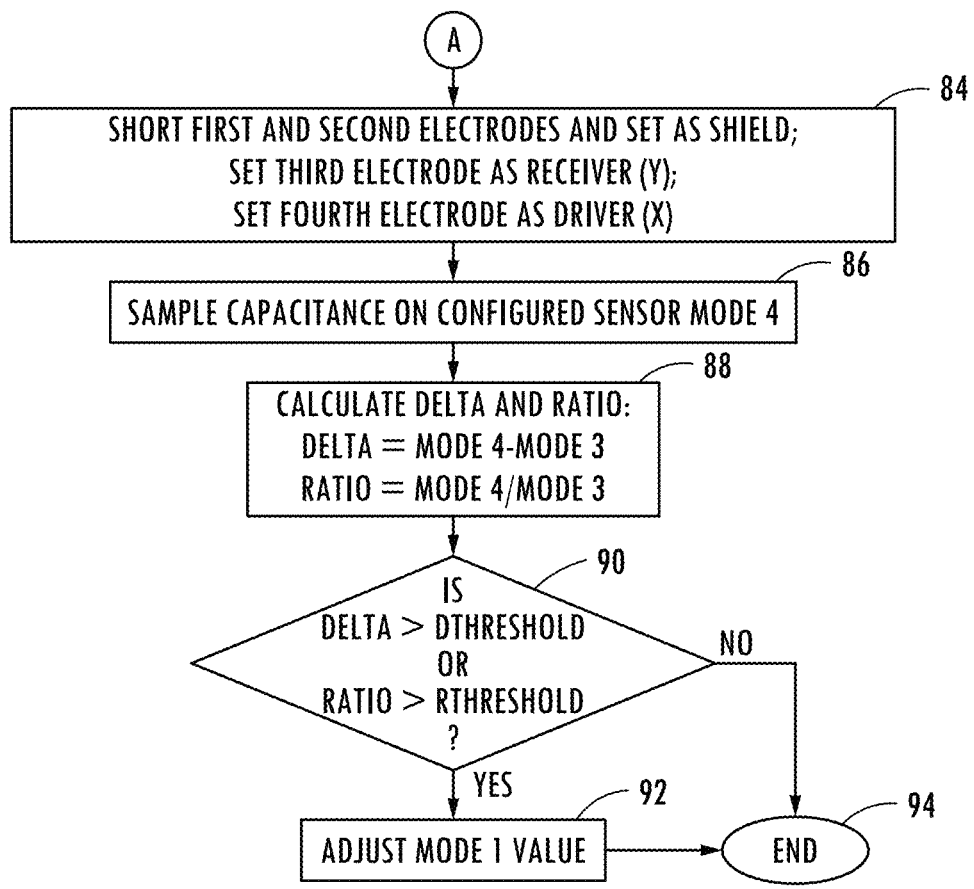

Referring to FIGS. 10A-10B, a routine 60 for controlling the controller 40 to sequentially switch the capacitive proximity sensor assembly 10 amongst the various operating modes is illustrated, according to one embodiment. The routine 60 is shown for operating the capacitive proximity sensor assembly 10 according to the first embodiment in each of modes 1-4. It should be appreciated that the routine 60 may be executed by the microprocessor 42 in the controller 40 and that the routine 60 may be stored in memory 44. The routine 60 may sample data and reconfigure the capacitive proximity sensor assembly 10 in the various modes at a sampling rate of about 20 milliseconds, according to one example. It should be appreciated that other sampling rates may be employed.

Routine 60 begins at step 62 to acquire data and then proceeds to step 64 to configure the controller in a first mutual capacitance sensor mode 1. In sensor mode 1, routine 60 proceeds to step 66 to set the first electrode with the drive signal X and to set the second electrode with the drive receive signal Y, and to set the third electrode as a shield. Thereafter, routine 60 proceeds to step 68 to sample the capacitance on the configured mutual capacitance sensor in sensor mode 1.

Next, routine 60 proceeds to step 70 to configure the controller in a self-capacitance sensor mode 2. In mode 2, routine 60 proceeds to step 72 to electrically short circuit the first and second electrodes together, to set the third electrode as a shield, and to electrically ground the fourth electrode. The shorted together first and second electrodes receive a self-capacitance input signal. Next, at step 74, routine 60 samples the capacitance of the configured self-capacitance sensor in sensor mode 2.

Next, routine 60 proceeds to step 76 to configure the controller in a mutual capacitance sensor mode 3. This includes electrically short circuiting the first and second electrodes together and setting the combined first and second electrodes with the drive signal X, setting the third electrode as with the receive signal Y and setting the fourth electrode as a shield in step 78. Next, in step 80, the capacitance of the configured mutual capacitance sensor in sensor mode 3 is sampled.

Next, at step 82, routine 60 configures the controller in a mutual capacitance sensor mode 4. This includes electrically short circuiting the first and second electrodes together, setting the combined first and second electrodes as a shield, setting the third electrode with the receive signal Y, and setting the fourth electrode with the drive signal X. The capacitance on the configured mutual capacitance sensor in sensor mode 4 is then sampled at step 86.

Routine 60 then proceeds to step 88 to calculate a delta value and a ratio value. The delta value is the difference in value of the sensed signals acquired in sensor modes 4 and 3. The ratio is a ratio of the sensed signals acquired in sensor mode 4 to the sensed signal acquired in mode 3. Next, at decision step 90, routine 60 determines if the delta value is greater than a threshold value Dthreshold or if the ratio value is greater than a threshold value Rthreshold and, if so, adjusts the sensor mode 1 value at step 92 by increasing or decreasing an offset based on known values stored in a lookup table to thereby calibrate the proximity sensor assembly 10 for environmental conditions, such as the presence of moisture on the surface of the proximity sensor assembly 10. If not, routine 60 ends at step 94.

It should be appreciated that the routine 60 may be repeated sequentially at a rapid pace, such that the sampling between the execution of the sensor configurations in modes 1, 2, 3 and 4 may occur at a sampling rate of 20 milliseconds, for example. As a result, the capacitive proximity sensor assembly 10 is able to operate sequentially in multiple modes with different configurations of capacitive sensors to sense various signals, particularly objects and input commands in four sensor modes pursuant to the first embodiment.

Figure 11A:
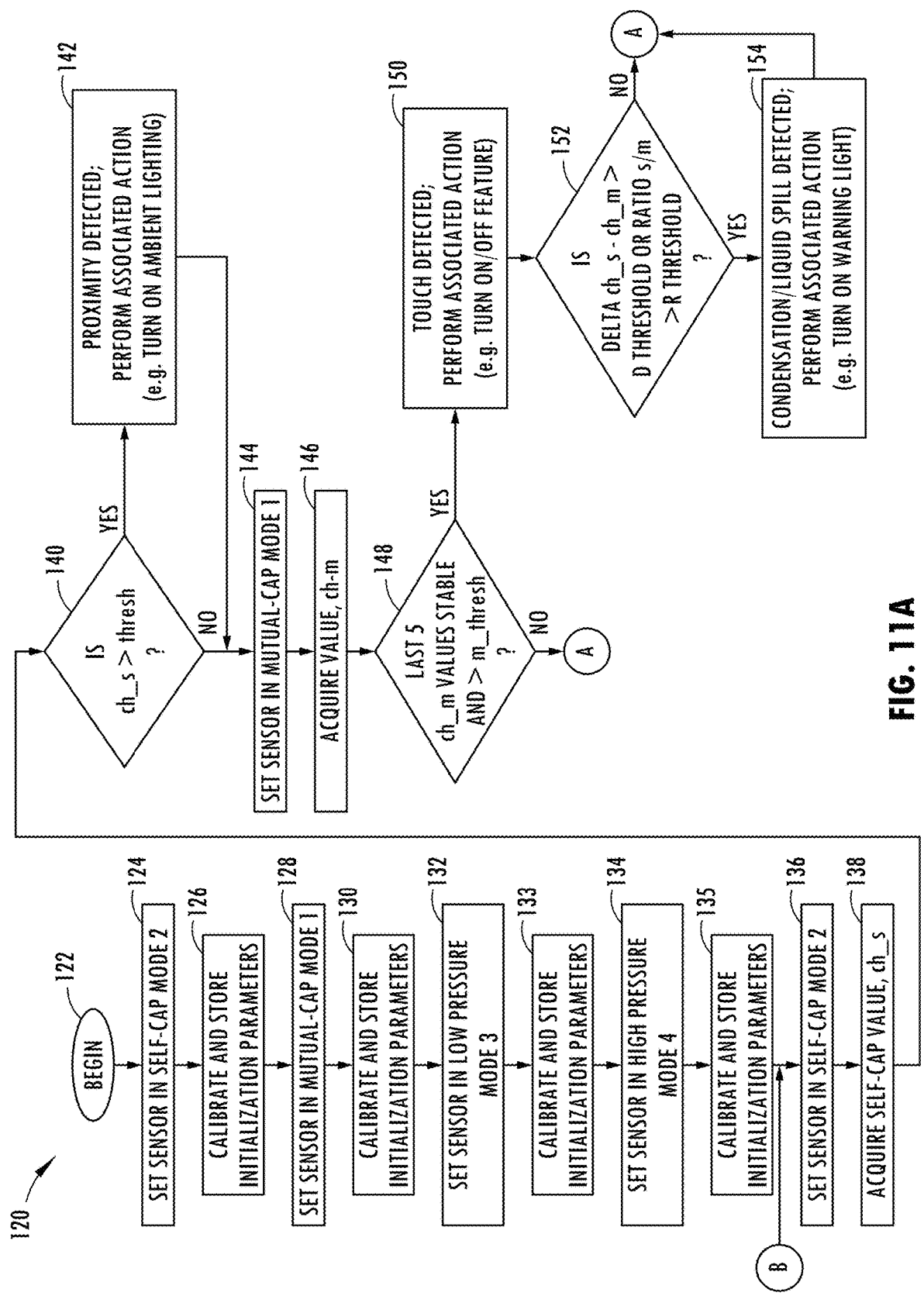
FIGS. 11A-11B is a flow diagram illustrating a routine for controlling the capacitive proximity sensor assembly of FIG. 1.
Figure 11B:
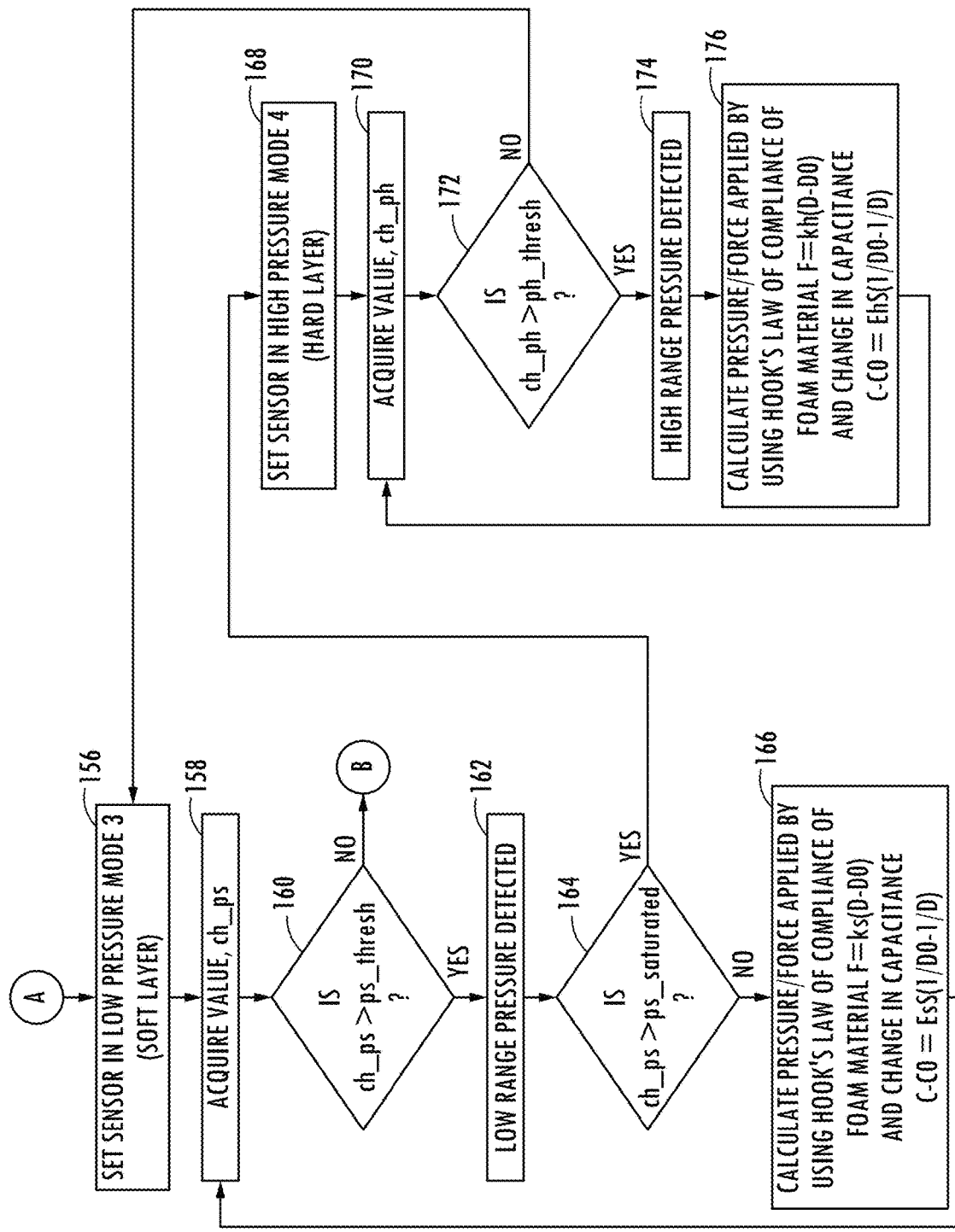
Figure 12:
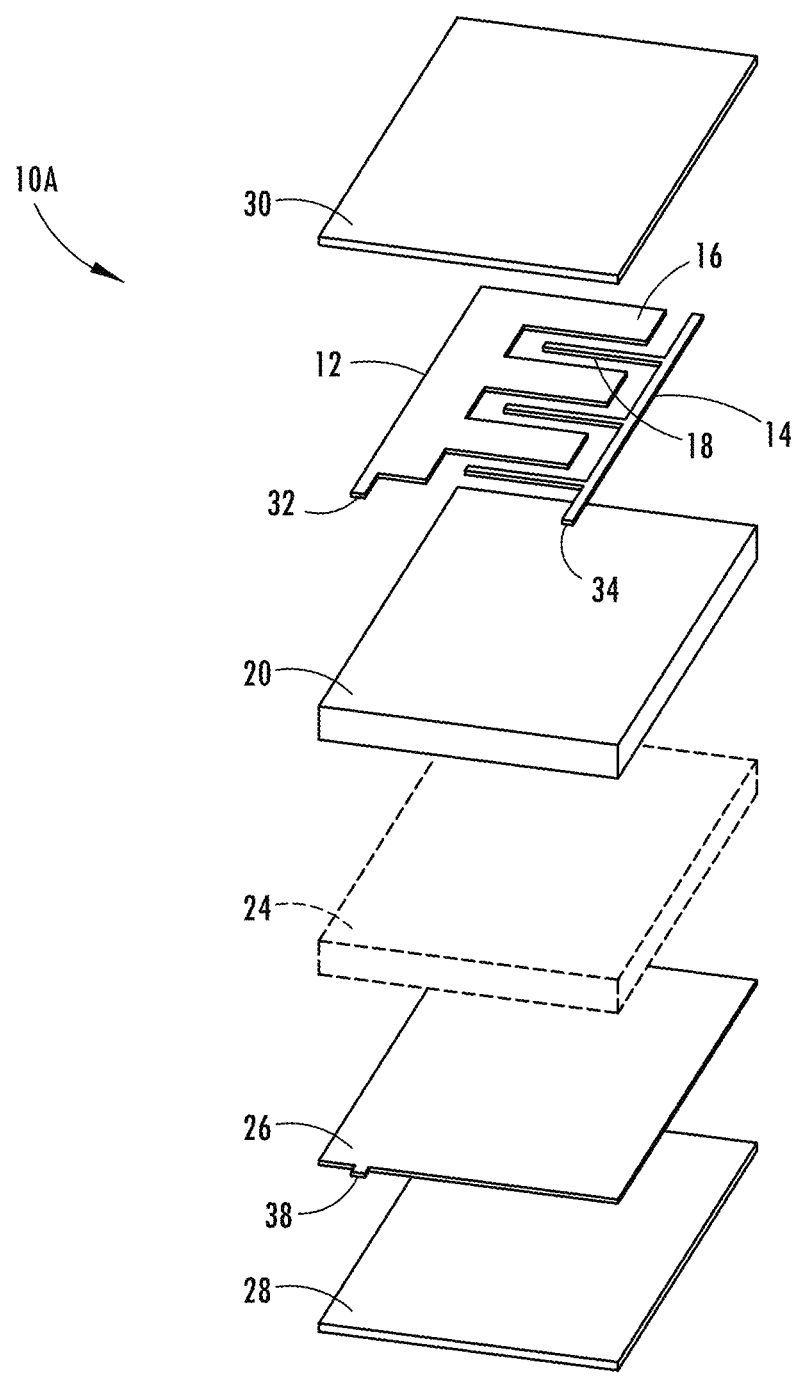
FIG. 12 is an exploded front perspective view of a capacitive proximity sensor assembly, according to a second embodiment.

Referring to FIGS. 11A-11B, a routine 120 for controlling the switching of the capacitive proximity sensor assembly 10 amongst the various operating modes with the controller is shown, according to one embodiment. Routine 120 begins at step 122 and proceeds to step 124 to set the sensor in the self-capacitance second sensor mode 2. It should be appreciated that routine 120 will perform an initialization and calibration for each mode once at startup. At step 126, routine 120 will calibrate and store initialization parameters in memory for second sensor mode 2. Proceeding to step 128, routine 120 will set the sensor in the mutual capacitance first sensor mode 1 and will proceed to step 130 to calibrate and store the initialization parameters in memory for first sensor mode 1. Routine 120 will then proceed to step 132 to set the sensor in the mutual capacitance third sensor mode 3 which is configured as a low pressure sensing mode and will then calibrate and store the initialization parameters in memory for low third sensor mode 3 at step 133. Proceeding to step 134, routine 120 will set the sensor in high pressure fourth sensor mode 4 and will then calibrate and store initialization parameters for the fourth sensor mode 4 at step 135.

Next, at step 136, routine 120 sets the sensor in a self-capacitance mode 2 and then proceeds to step 138 to acquire the self-capacitance value ch_s for current signal channel at step 138. At decision step 140, routine 120 determines if the acquired self-capacitance value ch_s is greater than a threshold value s_thresh and, if so, proceeds to step 142 to detect proximity of an object and perform any desired associated action, such as turning on an ambient light, for example. Following step 142 or if the signal channel ch_s is not greater than the threshold s_thresh, routine 120 proceeds to step 144 to set the sensor in a mutual capacitance mode 1 and then to step 146 to acquire a value ch_m for the current signal channel. Next, at decision step 148, routine 120 determines if the last five signal value ch_m are stable and greater than a threshold m_thresh and, if so, proceeds to step 150 to detect a touch and performs any desired associated actions such as turning on/off a feature. Following step 150 or if the last five signal values ch_m are not stable or greater than the threshold m_thresh, routine 120 proceeds to decision step 152 to determine if the delta value which is the difference between signal channel ch_s and ch_m, exceeds the threshold Dthresh or the ratio of values s/m is greater than Rthreshol and, if so, proceeds to step 154 to detect condensation/liquid spill and performs any desired action, such as turning on a warning light.

Following step 150 or if the delta value or ratio is not large, routine 120 proceeds to step 156 to set the sensor in the low pressure sensor mode 3 which may be due to deformation of the soft compliant layer. At step 158, routine 120 acquires a signal value ch_ps and at step 160 determines if the signal value ch_ps is greater than a threshold ps_thresh and, if so, detects low range pressure at step 162. If the signal ch_ps is not greater than ps_thresh, routine 120 returns to step 136. Following detection of a pressure applied to the sensor, routine 120 proceeds to decision step 164 to determine if the signal ch_ps is greater than ps_saturated and, if not, proceeds to step 166 to calculate pressure/ force applied by using hook's law of compliance of foam material F=ks(D−D0) and change in capacitance C−C0=EsS (1/D0−1/D)(D)(3) and then returns to step 158.

If the signal ch_ps is determined to be greater than p_saturated, routine 120 proceeds to step 168 to set the senor in a high range pressure sensor mode 4 due to a change in capacitance in mode 4 which is sensing pressure due to deformation of the hard compliant layer. Next, at step 170, a value ch_ph is acquired and then proceeding to decision step 172 the value ch_ph is compared to a threshold ph_thresh and, if the value is greater than the threshold value, detects high range pressure at step 174. Next, at step 176, routine 120 calculates pressure/force applied by using hook's law of compliance of foam material F=kh(D−D0) and change in capacitance C−C0=EhS(1/D0−1/D) (3). If the value ch_ph drops below the threshold ph_thresh, routine 120 proceeds to block 156. It should be appreciated that the steps associated with the individual sensor modes 1-4 of routine 120 may be repeated with a cycle time of 100-500 milliseconds, for example.

Referring to FIGS. 12-15, a capacitive proximity sensor assembly 10A is shown according to a second embodiment. In this embodiment, the capacitive proximity sensor assembly 10A employs the pair of first and second electrodes 12 and 14 having respective first and second interleaved conductive fingers 16 and 18 and signal terminals 32 and 34. The first and second electrodes 12 and 14 may be covered with a dielectric front cover 30 having a front surface. In addition, a third electrode 26 having a signal terminal 38 is provided which may be similar to the fourth electrode shown in the first embodiment. Disposed between the pair of first and second electrodes 12 and 14 and the third electrode 26 is a first compliant dielectric layer 20 and an optional second compliant dielectric layer 24. The first dielectric layer 20 may include a soft compressible material having a first compressibility, such as foam, while the optimal second compliant dielectric layer 24 may include a more rigid, less compliant material having a second stiffer compressibility, such as polyurethane. As a result, the first and second compliant dielectric layers 20 and 24 dielectrically isolate the third electrode 26 from the pair of first and second electrodes 12 and 14 and are compressible at two different compression factors that may be plotted on two different slopes. For example, when a user applies pressure or force to the front surface of the cover 30 of the capacitive proximity sensor assembly 10, the first compliant layer 20 will initially compress to allow at least a portion of the first and second electrodes 12 and 14 to move closer to the third electrode 26. When the first compliant layer 26 is fully compressed, the second compliant 24 will begin to compress when a greater amount of force or pressure is applied on the front surface of the cover 30. The capacitive proximity sensor assembly 10A may detect the force or pressure applied onto the cover 30 based on the sensed distance between the pair of first and second electrodes 12 and 14 and the third electrode 26.

Figure 13:
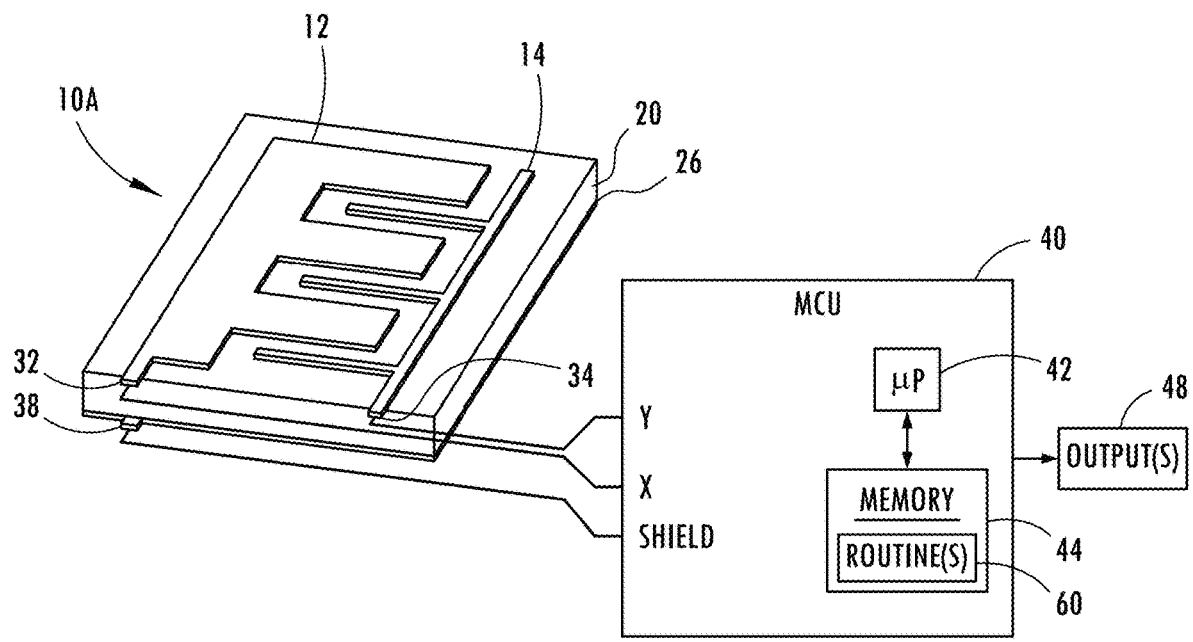
FIG. 13 is a front perspective view of the capacitive proximity sensor assembly shown in FIG. 12 and controlled by a controller to sample signals in a first sensor mode.

Referring to FIG. 13, the capacitive proximity sensor assembly 10A is shown configured in a first mutual capacitance sensor mode to provide a first sensor in which the first electrode 12 is configured with the drive signal X and the second electrode 14 is configured with the receive signal Y, while the third electrode 26 is open circuited to operate as a conductive shield. In this first sensor mode, the first and second electrodes may sense mutual capacitance, such as a touch, a swipe or very close proximity of a user to the front surface of the cover 30.

Figure 14:
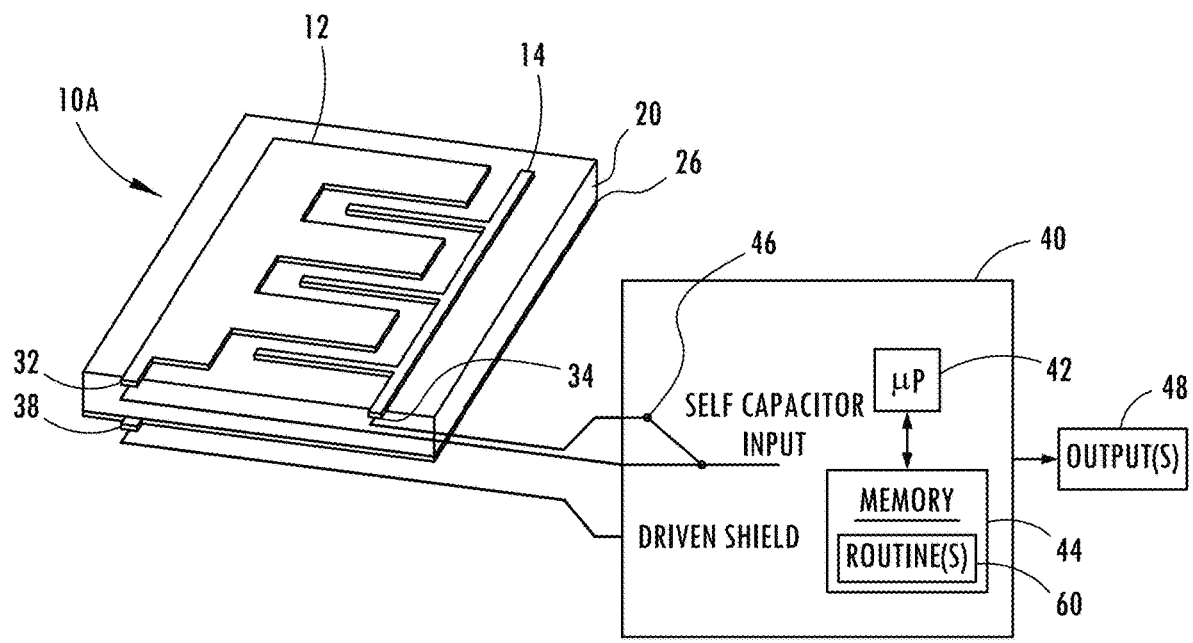
FIG. 14 is a front perspective view of the capacitive proximity sensor assembly shown in FIG. 12 and controlled by a controller to sample signals in a second sensor mode.

The capacitive proximity sensor assembly 10A may be reconfigured to a second self-capacitance sensor mode to provide a second sensor shown in FIG. 14 in which the first and second electrodes 12 and 14 are electrically short circuited together via switch 46 by controller 40 and the third electrode 26 is driven to a voltage potential to operate as a conductive shield. In this embodiment, the electrically shorted together first and second electrodes 12 and 14 perform a self-capacitance sensor operation by applying an input signal and subsequently sensing the signal to operate as a self-capacitance sensor in the second sensor mode and can operate to detect proximity of a user more remote than in the first sensor mode, generally with a lessened sensitivity.

Figure 15:
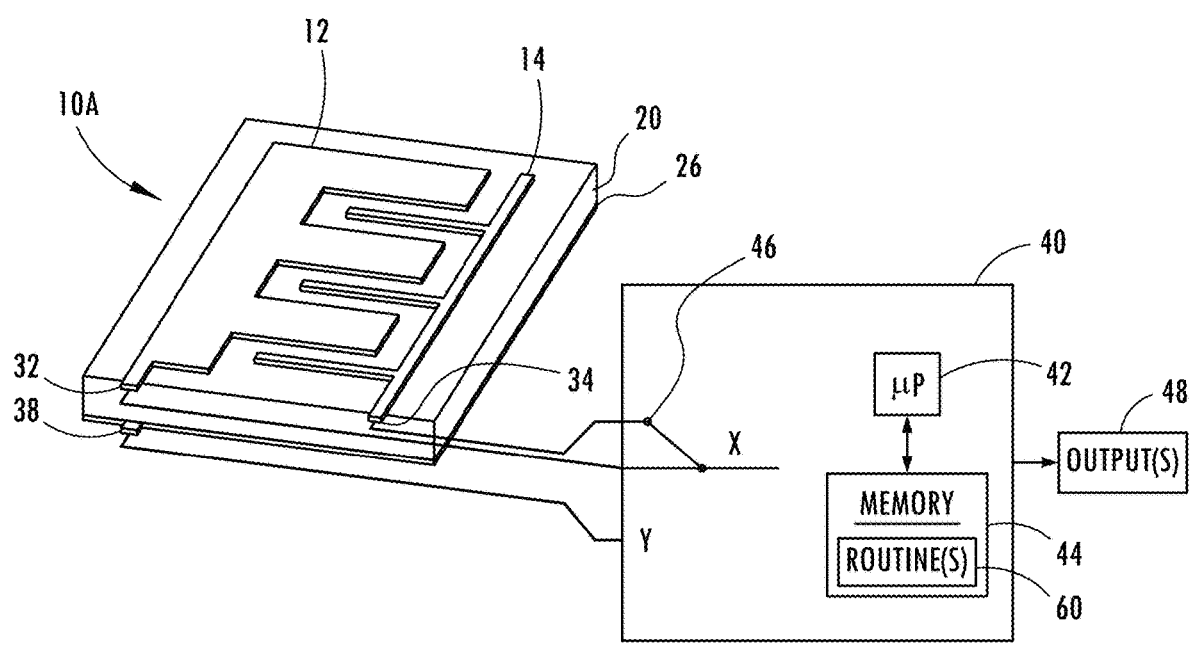
FIG. 15 is a front perspective view of the capacitive proximity sensor assembly shown in FIG. 12 and controlled by a controller to sample signals in a third sensor mode.

The capacitive proximity sensor assembly 10A may be reconfigured to a mutual capacitance third sensor mode to provide a third sensor as shown in FIG. 15 in which the first and second electrodes 12 and 14 are electrically short circuited with a switch 46 via controller 40 and operate with the drive signal X applied thereto while the third electrode 26 operates with the receive signal Y. In this mode, pressure or force applied to the front surface of the cover 30 downward causes at least a portion of the first and second electrodes 12 and 14 to move downward is sensed upon compressing one or both of the first and second compliant layers 20 and 24. It should be appreciated that the capacitive proximity sensor assembly 10A may be controlled by the controller 40 executing a routine to switch amongst sensor modes 1, 2 and 3 sequentially at a fast sampling rate similar to that described above in connection with routine 60 of FIGS. 10A-10B.

Figure 16:
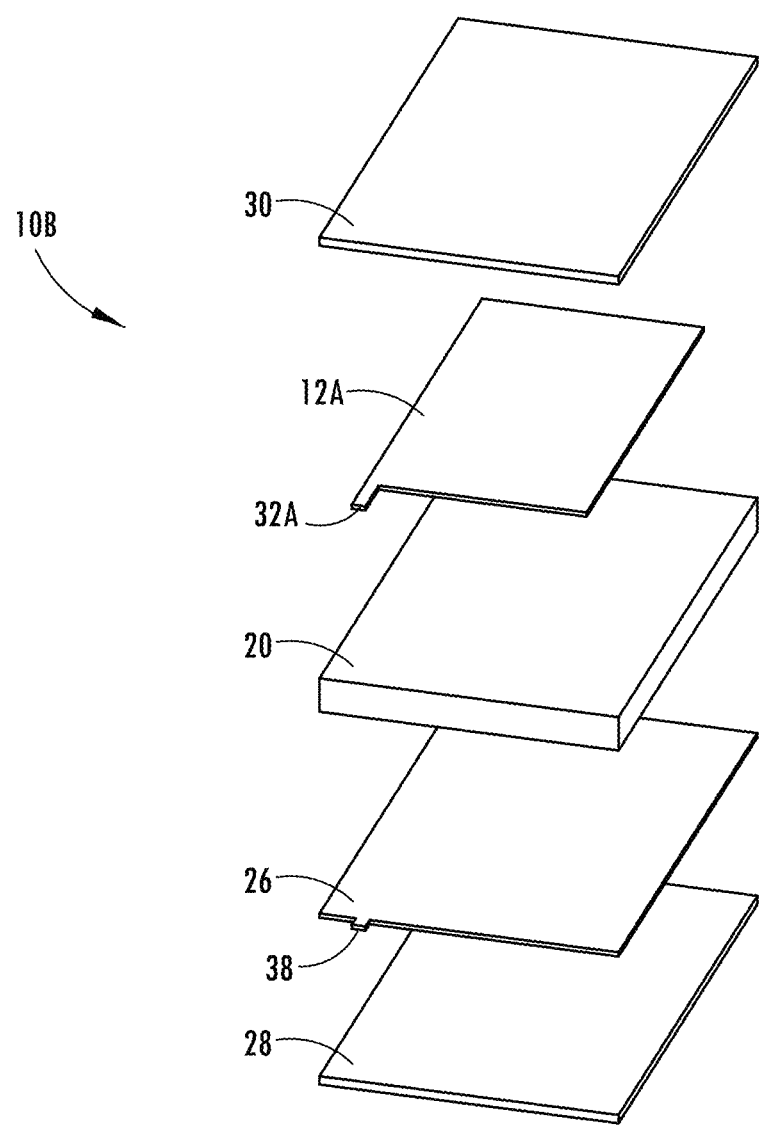
FIG. 16 is an exploded front perspective view of a capacitive proximity sensor assembly, according to a third embodiment.
Figure 17:
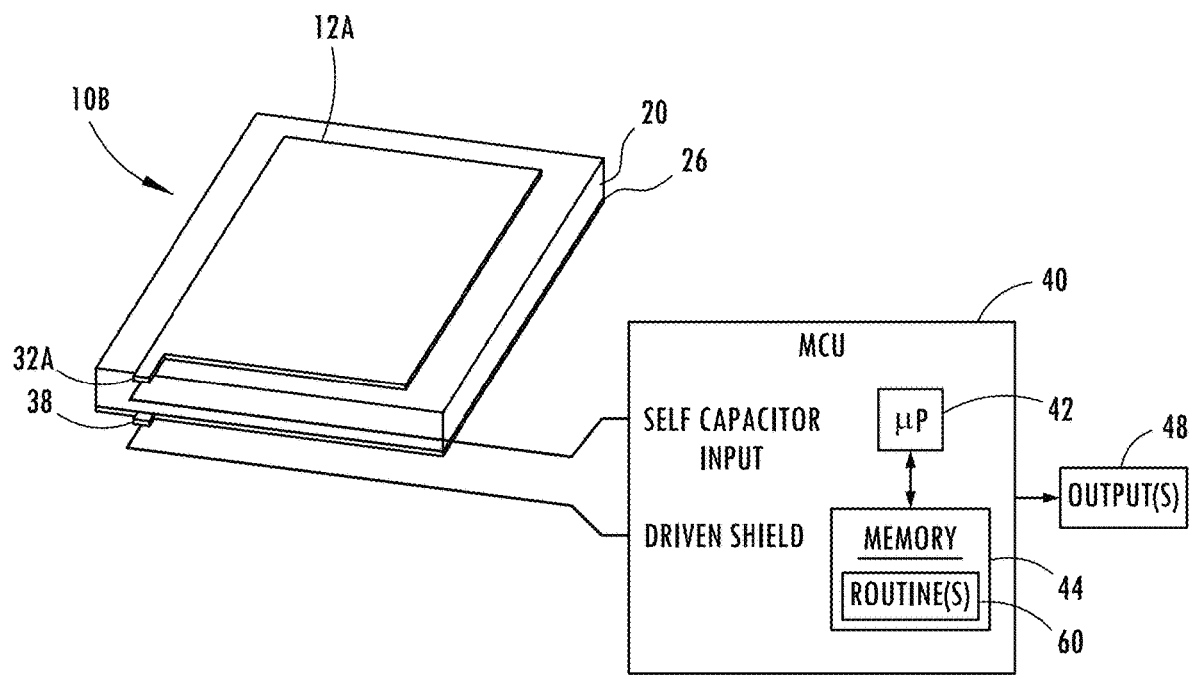
FIG. 17 is a front perspective view of the capacitive proximity sensor assembly shown in FIG. 16 and configured with a controller to sample signals in a first sensor mode.

Referring to FIGS. 16-18, a capacitive proximity sensor assembly 10B is illustrated, according to third embodiment. In this embodiment, a first electrode 12A having a signal terminal 32A is dielectrically isolated and spaced from a second electrode 26 having a signal terminal 38 via a compliant dielectric layer 20. The compliant dielectric layer 20 may include a soft compliant layer such as foam, according to one example. The first and second electrodes 12A and 26 may each comprise a sheet of conductive material, such as a printed ink that may be printed on the top and bottom sides of the compliant layer 20. The capacitive sensor assembly 10B may further include a dielectric front layer 30 and a dielectric bottom layer 28 to dielectrically isolate the sensor and protect the conductive electrodes.

The capacitive sensor assembly 10B may be configured to operate in a first self-capacitance sensor mode to provide a first sensor as shown in FIG. 17 in which the first electrode 12A is applied with a self-capacitance input signal and subsequently senses an output signal to operate as a self-capacitance sensor and the second electrode 38 is driven to a voltage to operate as a shield. In this embodiment, proximity of an object above the top front surface may be detected with self-capacitance sensing.

The capacitive sensor assembly 10B may be configured to operate in a second mutual capacitance sensor mode to provide a second sensor as shown in FIG. 18. In this sensor mode, the first electrode 12A operates with the drive signal X and the second electrode 26 operates with the receive signal Y. As such, pressure or force applied to the front surface of the front cover 30 of the capacitive proximity sensor assembly 10B may be sensed as the compliant layer 20 squeezes due to the force or pressure so that at least a portion of electrode 12A moves toward electrode 26.

The capacitive proximity sensor assemblies 10, 10A and 10B may be useful for sensing proximity such as a touch or a swipe on or proximate to the front surface of the cover 30, and proximity of an object more remote from the cover 30, and pressure or force applied to the front surface of the cover 30 in various applications including applications onboard vehicles. In one example, the capacitive proximity sensor assembly 10 may be employed on a vehicle steering wheel to sense inputs applied to the steering wheel to control various vehicle features, such as to command stowage of a steering wheel in an autonomous vehicle operation to a stowed non-use position, or movement of the steering wheel into an alternate orientation such as a tray table, for example, or to return the steering wheel to a steering use position. In another example, the capacitive proximity sensor assembly may be employed in one or more vehicle seats to sense inputs applied to control various features related to the vehicle, such as to adjust seat position and orientation, and other vehicle seat controls. According to a further example, the capacitive sensor assembly may be employed on vehicle floor mats for sensing input commands via movement of an occupant's foot or feet which may be used to control opening and closing of a door and/or movement of driving pedals such as the brake pedal and acceleration pedal between use and stowed positions. It should be appreciated that one or more of the capacitive sensor assemblies 10, 10A and 10B may be employed on other vehicle surfaces and may be employed in non-vehicle applications.

Referring to FIGS. 19-25D, one example of the use of the capacitive proximity sensor assembly 10 on a steering wheel 102 in a vehicle 100, such as a wheeled motor vehicle, is illustrated, according to one example. In this example, the capacitive proximity sensor assembly 10 configured according to the first embodiment is assembled into the various layers of the steering wheel 102 at locations where a driver input such as a touch, a first light push force, a second greater push force, a first light pull force or a second greater pull force can be detected as a user command input to perform a desired function such as to move the steering wheel from a driver use position to a stowed position or move the steering wheel from a use position to a horizontal tray position or move the steering wheel back to the driver use position. As such, the four electrodes 12, 14, 22 and 26 are located on the steering wheel 102 on the front side for detecting touch and push force and on the back side for detecting a pull force. The sensor electrodes 12, 14, 22 and 26 may extend the entire circumference of the steering wheel 102 or may be located at discrete locations around the circumference of the steering wheel 102.

Figure 21:
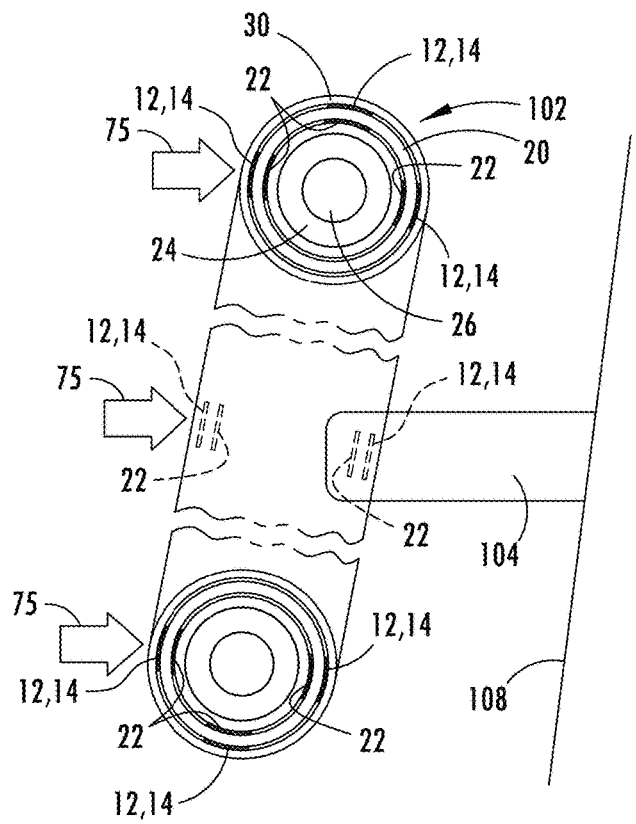
FIG. 21 is a cross-sectional view of the steering wheel in a driver use position with an input force applied to the front side of the steering wheel to command movement to the stowed position.
Figure 22:
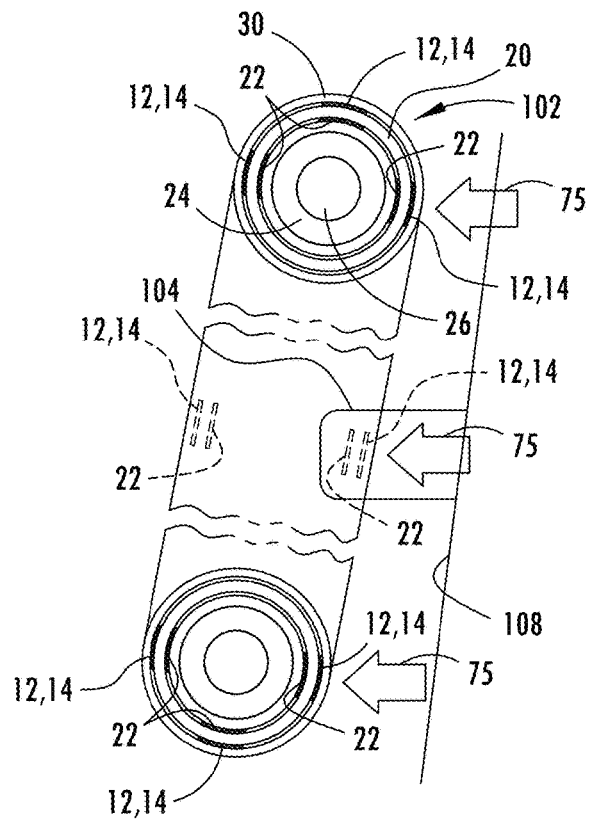
FIG. 22 further illustrates the steering wheel in a stowed position with an input force applied from behind the steering wheel to move command to the driver use position.
Figure 23:
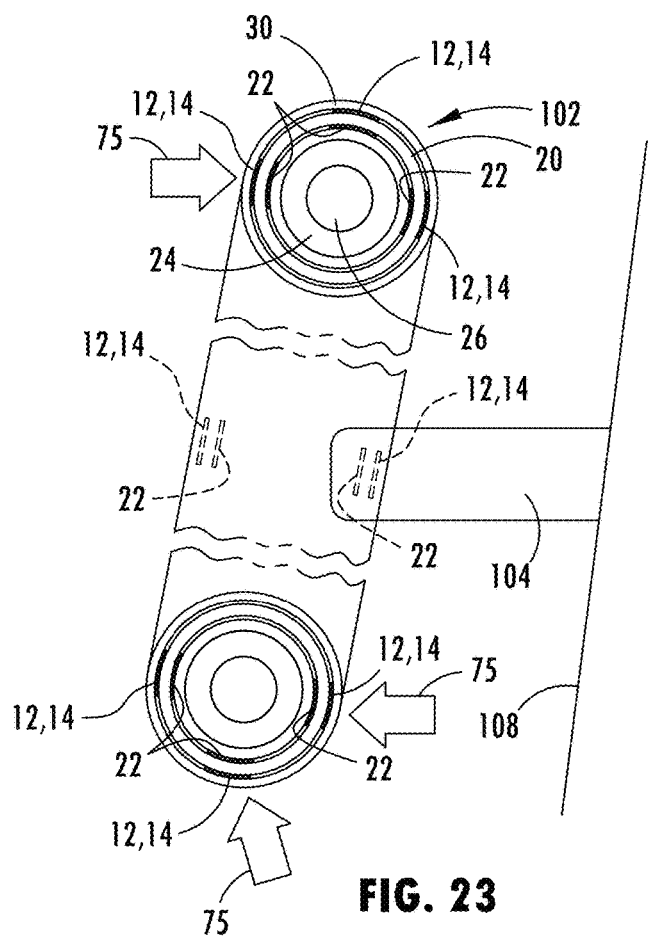
FIG. 23 further illustrates the steering wheel with an input force applied in a rotational direction to command movement to a tray position.

As seen in FIGS. 21 and 22, the first and second electrodes 12 and 14 are located just underneath the outer cover 30 which may include leather, plastic, or other steering wheel cover material that is electrically dielectric. The first and second electrodes 12 and 14 may be located at four different locations spaced by approximately 90° relative to one another. Extending below the first and second electrodes 12 and 14 and covering the entire circumference of the steering wheel 102 is the first compliant dielectric layer 20, which may include foam that is compressible with a light force or greater applied to the steering wheel 102. Located below the first compliant layer 20 is the third electrode 22 which may be positioned at locations below the portions of the first and second electrodes 12 and 14, according to one example.

The first electrode 12, second electrode 14 and third electrode 22 may be printed onto one or more of the layers above or below the corresponding electrode or may be prefabricated electrodes that are installed. Located below the third electrode 22 is the more rigid second compliant dielectric layer 24 which may include a layer of polyurethane material that is deformable or compressible with a greater amount of force than the compressibility of the first compliant dielectric layer 20. At the core of the steering wheel 102 below the second compliant dielectric layer 24 is a core conductive material, such as magnesium, that forms the fourth electrode 26. The fourth electrode 26 is generally rigid and may not be compressible, according to one example.

Figure 24:
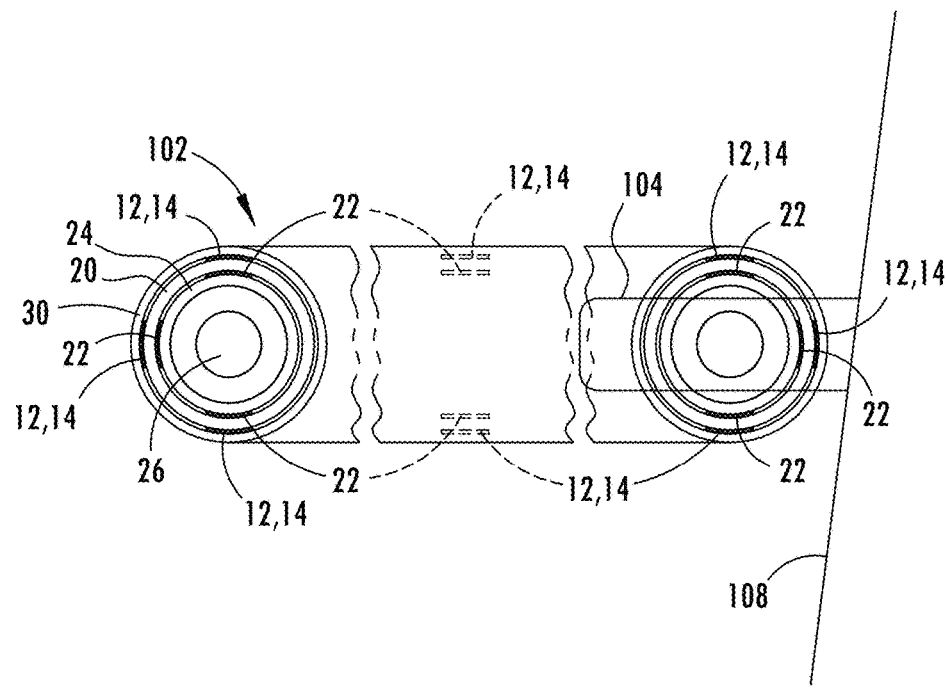
FIG. 24 further illustrates the steering wheel in a horizontal position to provide a tray position.
Figure 25A:
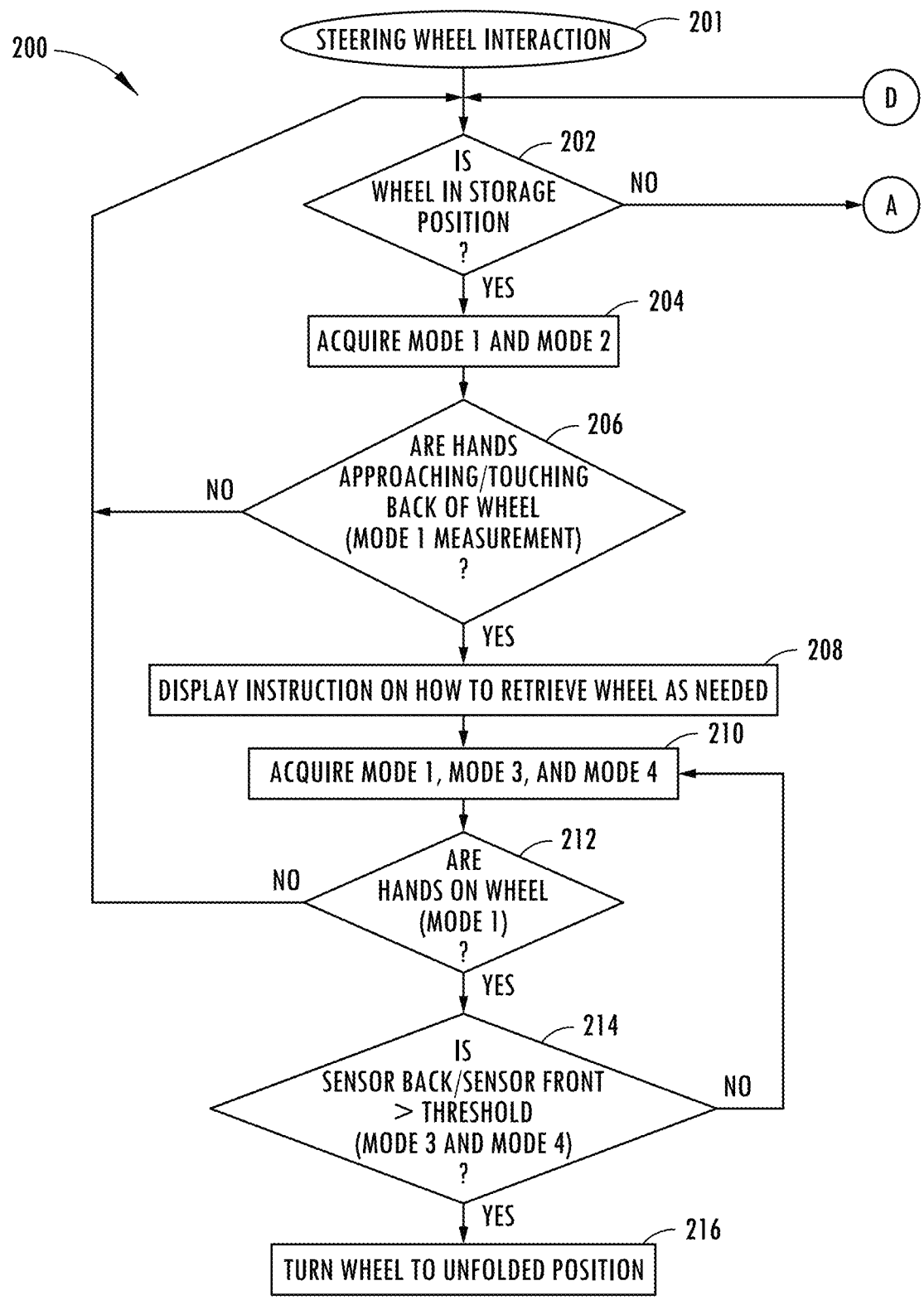
FIGS. 25A-25D illustrate a flow diagram for controlling the steering wheel based on signals sensed with the capacitive proximity sensor assembly, according to the first embodiment.
Figure 25B:
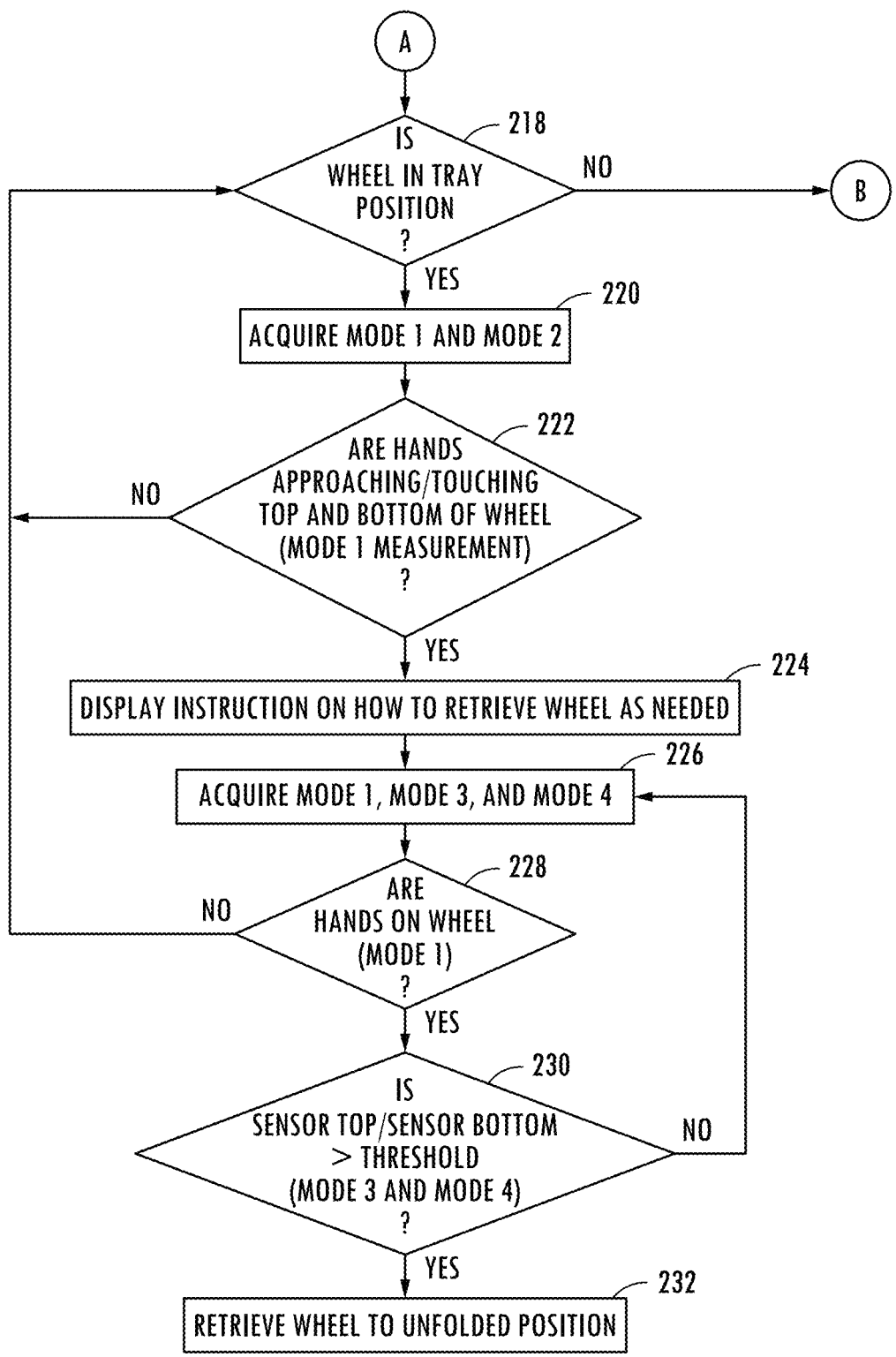
Figure 25C:
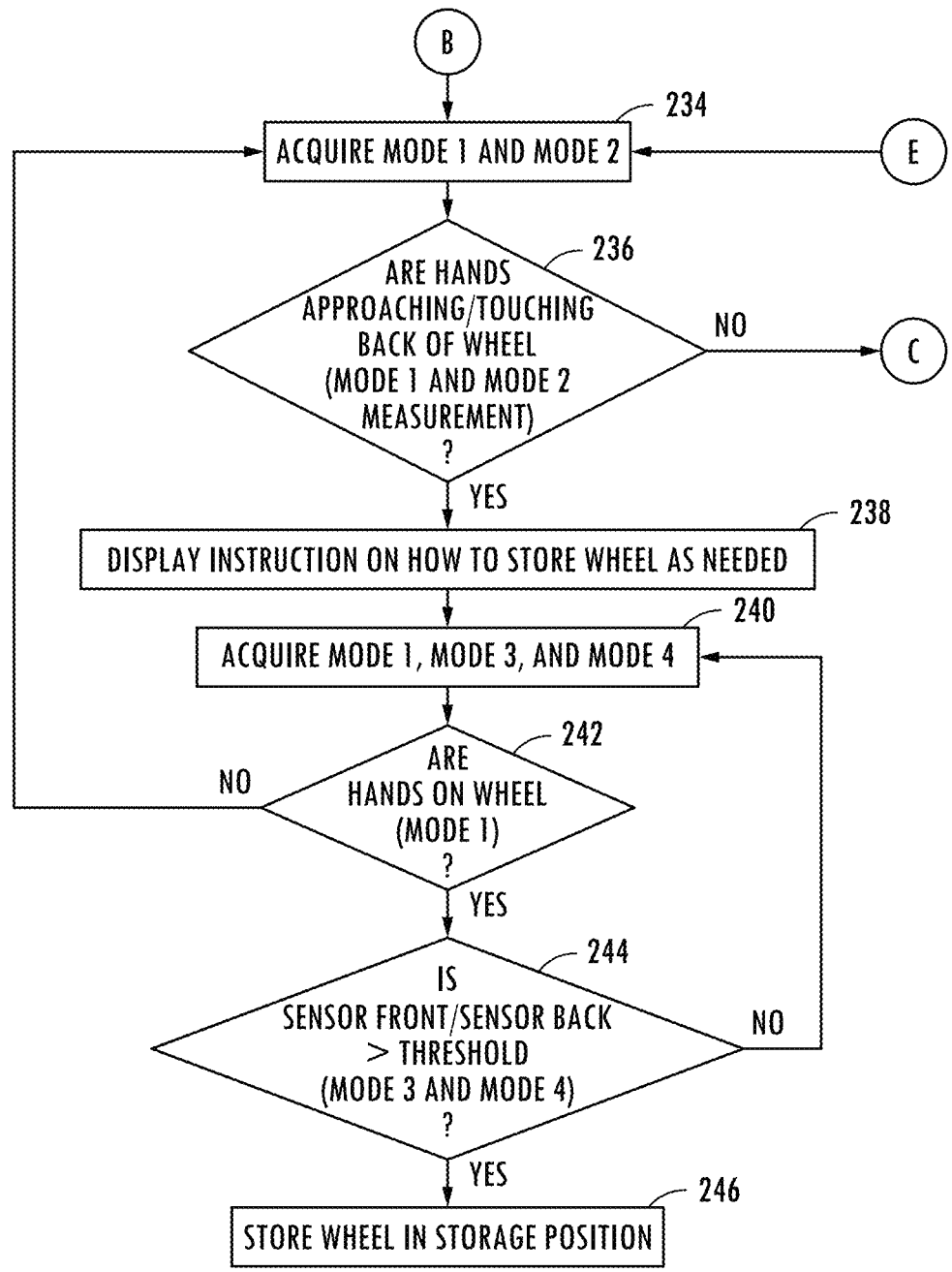
Figure 25D:
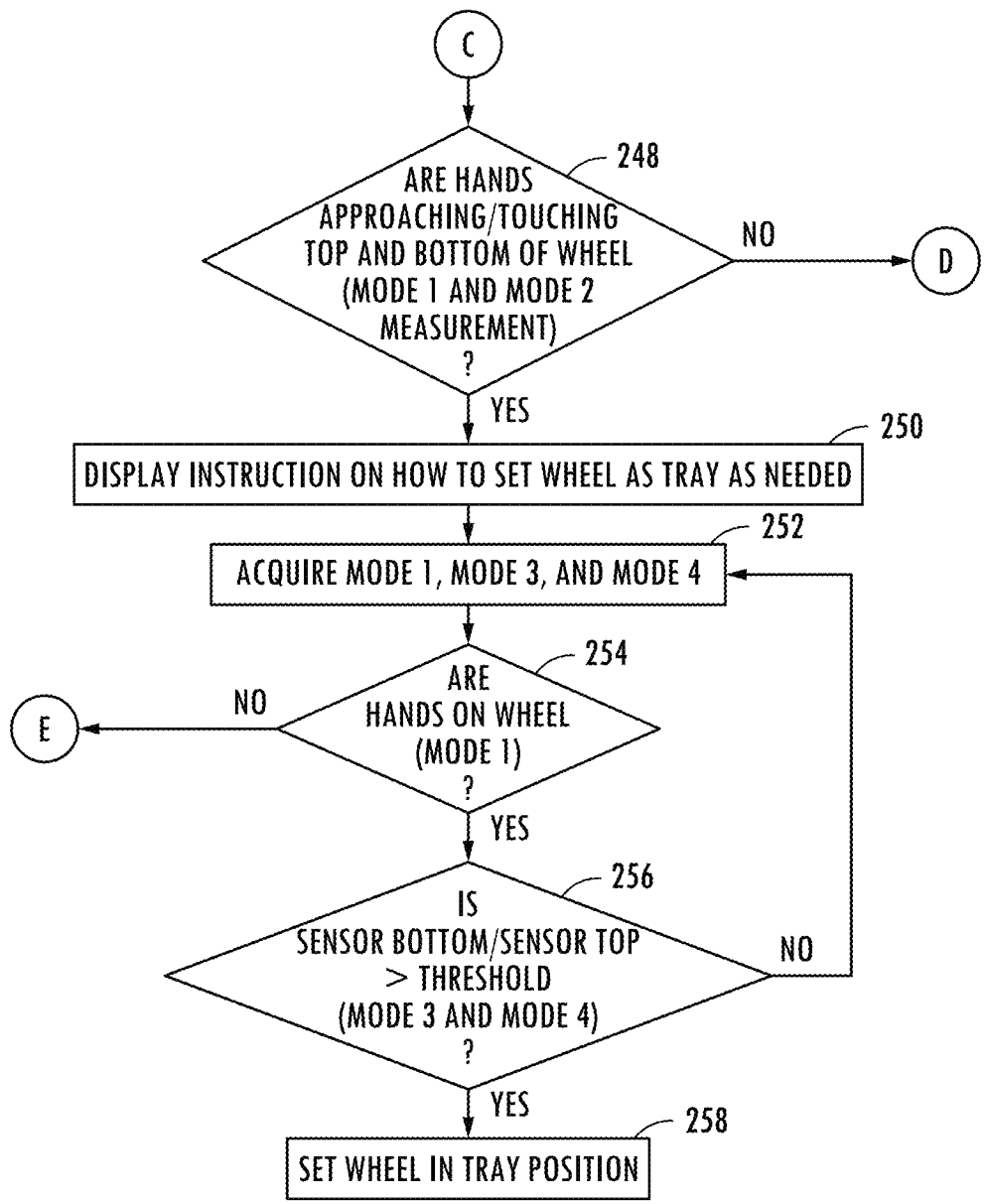

The steering wheel 102 may be controlled to move between a driver use position shown in FIG. 21 in which the steering wheel 102 is positioned for use by a driver to steer the vehicle 100 to move the steering wheel 102 to a stored non-use position shown in FIG. 22 and to a folded tray position as shown in FIG. 24. When in the driver use position as seen in FIG. 21, a user may apply force as shown by arrows 75 to the front side of the steering wheel 102 to provide an input command to move the steering wheel 102 to the stored position seen in FIG. 22 when the vehicle 100 is in an autonomous vehicle mode or when the vehicle 100 is not moving or operating. As such, the steering wheel 102 can be stored, thereby giving more room to the occupant seated in front of the steering wheel 102. To move the steering wheel 102 from the stored position back to the use position, a user may apply a pulling force as shown by arrows 75 in FIG. 22 to pull the steering wheel 102 on the back side as an input command that may be detected by the capacitive proximity sensor assembly 10. Further, a user may input a rotational command to the steering wheel 102 as seen by the arrows 75 in FIG. 23 in which the user may push with force on one side of the steering wheel 102 in and pull with force on the other side of the steering wheel 102 so as to input a command to rotate the steering wheel 102 to a substantially horizontal tray position as seen in FIG. 24. The force applied to the steering wheel 102 is applied over an area which results in pressure that may be sensed by the capacitive proximity sensor assembly 10. In this position, the steering wheel 102 may serve as a tray table to hold objects, such as to form a work table when the vehicle 100 is in the autonomous vehicle mode or not operable, according to one example. Accordingly, the capacitive proximity sensor assembly 10 may advantageously detect input commands such as a touch or swipe applied to the front or rear of the steering wheel 102, or a light force command applied to the front of the steering wheel 102, or a greater force applied to the front of the steering wheel 102 and a light force or greater force as a pulling command applied to the rear of the steering wheel 102 by employing the four electrode embodiment of the capacitive proximity sensor assembly 10 having four modes of operation, according to one embodiment.

Referring to FIGS. 25A-25D, one example of a routine 20 for controlling the steering wheel equipped with the capacitive proximity sensor assembly 10 is illustrated. Routine 200 begins at step 201 by sensing steering wheel interaction, and then proceeds to step 202 to determine if the steering wheel is in the storage position. If the steering wheel is in the storage position, routine 200 proceeds to step 204 to acquire the mode 1 and mode 2 sensor signals and then to decision step 206 to determine if a user's hands are approaching or touching the back side of the steering wheel using a sensor mode 1 sensor measurement. If not, routine 200 returns to step 202. If the user's hands are approaching or touching the back side of the steering wheel, routine 200 proceeds to step 208 to display instructions on how to retrieve the steering wheel as needed. Next, routine 200 acquires sensor mode 1, sensor mode 3 and sensor mode 4 sensor signals and proceeds to decision step 212 to determine if the user's hands are on the wheel using the sensor mode 1 sensor signal and, if not, returns to step 202. If the user's hands are on the steering wheel, routine 200 proceeds to decision step 214 to determine if the ratio of the sensor on the back side to the sensor on the front side is greater than a threshold in sensor modes 3 and 4 and, if not, returns to step 210. If the ratio of the sensor on the back side to the sensor on the front side is greater than the threshold, routine 200 proceeds to step 216 to turn the steering wheel to the unfolded driver use position.

If the steering wheel is not determined to be in the storage position at decision step 202, routine 200 proceeds to step 218 to determine if the steering wheel is in the tray table position and, if so, acquires the sensor mode 1 and sensor mode 2 sensor signals at step 220. Next, at decision step 222, routine 200 determines if the user's hands are approaching/touching the top and bottom of the steering wheel using a sensor mode 1 sensor measurement and, if not, returns to step 218. If the user's hands are approaching/touching the top and bottom of the steering wheel, routine 200 proceeds to step 224 to display instructions on how to retrieve the steering wheel as needed. Next, routine 200 proceeds to step 226 to acquire the sensor mode 1, sensor mode 3 and sensor mode 4 sensor signals, and to the decision step 228 to determine if the user's hands are on the steering wheel using the sensor mode 1 sensor signal and, if not, returns to step 218. If the user's hands are on the steering wheel, routine 200 proceeds to decision step 230 to determine if the ratio of the top sensor to the bottom sensor is greater than a threshold in sensor modes 3 and 4 and, if not, returns to step 226. If the ratio of the top sensor to the bottom sensor is greater than a threshold, routine 200 proceeds to step 232 to retrieve the steering wheel to move to the unfolded driver use position.

If the steering wheel is determined to not to be in the tray table position at decision step 218, routine 200 proceeds to step 234 to acquire sensor mode 1 and sensor mode 2 sensor signals, and then to decision step 236 to determine if the user's hands are approaching/touching the back side of the steering wheel using sensor mode 1 and sensor mode 2 sensor measurements and, if so, proceeds to step 238 to display instructions on how to store the steering wheel as needed. Next, routine 200 acquires the sensor mode 1, sensor mode 3 and sensor mode 4 sensor signals at step 240, and then proceeds to decision step 242 to determine if the user's hands are on the steering wheel in mode 1 and, if not, returns to step 234. If the user's hands are on the steering wheel, routine 200 proceeds to decision step 244 to determine if the ratio of the sensor front to the sensor back is greater than a threshold in sensor modes 3 and 4 and, if not, returns to step 240. If the ratio of the front sensor to the back sensor is greater than the threshold, routine 200 proceeds to step 246 to store the steering wheel in the storage position.

If the user's hands are determined to not to be approaching/touching the back side of the steering wheel in decision step 236, routine 200 proceeds to decision step 248 to determine if the user's hands are approaching/touching the top and bottom of the steering wheel using sensor mode 1 and sensor mode 2 sensor measurements and, if not, returns to the beginning at decision step 202. If the user's hands are approaching/touching the top and bottom of the steering wheel, routine 200 proceeds to step 250 to display instructions on how to reconfigure the steering wheel as a tray table as needed which is a generally horizontal orientation. Next, mode sensor signals for sensor mode 1, sensor mode 3 and sensor mode 4 are acquired at step 252. At decision step 254, routine 200 determines if the user's hands are on the steering wheel using mode 1 and, if not, returns to step 234. If the user's hands are on the steering wheel, routine 200 proceeds to decision step 256 to determine if a ratio of the sensor bottom to sensor top is greater than a threshold in sensor modes 3 and 4 and, if not, returns to step 252. If the ratio of the sensor bottom to the sensor top is greater than the threshold, routine 200 proceeds to step 258 to reconfigure the steering wheel to the tray position.

Accordingly, it should be appreciated that the one or more of the capacitive proximity sensor assemblies 10, 10A and 10B may be employed onboard a vehicle, such as on a steering wheel to control command inputs to the steering wheel. However, it should be appreciated that the capacitive proximity sensor assemblies 10, 10A and 10B may be employed on various other applications, according to other embodiments. The capacitive proximity sensor assemblies 10, 10A and 10B advantageously allow for sensing in various sensor arrangements that sequentially change rapidly due to signal control and sampling by the microprocessor in the controller so as to detect various sensed inputs with sensors that employ shared electrodes.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A capacitive proximity sensor assembly comprising:
a first electrode;
a second electrode;
a first compliant dielectric layer disposed between the first and second electrodes; and
a controller processing signals associated with the first and second electrodes and selectively reconfiguring operation of the first and second electrodes in different proximity sensor arrangements to provide a plurality of capacitive sensors.

2. The capacitive proximity sensor assembly of claim 1, wherein the first electrode comprises a pair of electrodes that are configurable to generate a mutual capacitance to provide a first capacitive sensor and are further configurable to generate a self-capacitance to provide a second capacitive sensor.

3. The capacitive proximity sensor assembly of claim 2, wherein the pair of electrodes comprises a first plurality of capacitive fingers and a second plurality of electrode fingers, wherein the first plurality of electrode fingers are interdigitated with the second plurality of electrode fingers.

4. The capacitive proximity sensor assembly of claim 3, wherein the first and second electrodes provide a third capacitive sensor.

5. The capacitive proximity sensor assembly of claim 4 further comprising:
a third electrode; and
a second compliant dielectric layer disposed between the second electrode and the third electrode, wherein the second and third electrodes provide a fourth capacitive sensor.

6. The capacitive proximity sensor assembly of claim 5, wherein the controller sequentially samples signals associated with each of the first, second, third and fourth capacitive sensors.

7. The capacitive proximity sensor assembly of claim 6, wherein the pair of electrodes are shorted together and move towards the second electrode when the first compliant dielectric is compressed with force so as to form a pressure sensor.

8. The capacitive proximity sensor assembly of claim 1, wherein the assembly is located on a vehicle.

9. The capacitive proximity sensor assembly of claim 8, wherein the proximity sensor assembly is located on a steering wheel of the vehicle.

10. A capacitive proximity sensor assembly comprising:
first and second electrodes having first and second fingers configurable to form a mutual capacitance;
a third electrode;
a first compliant dielectric layer disposed between the first and second electrodes and the third electrode;
a fourth electrode;
a second compliant dielectric layer disposed between the third and fourth electrodes; and
a controller processing signals associated with the first, second, third and fourth electrodes and selectively reconfiguring operation of the first, second, third and fourth electrodes in different proximity sensor arrangements to provide a plurality of capacitive sensors.

11. The capacitive proximity sensor assembly of claim 10, wherein the first electrode comprises a first plurality of capacitive fingers and the second electrode comprises a second plurality of electrode fingers, wherein the first plurality of electrode fingers are interdigitated with the second plurality of electrode fingers.

12. The capacitive proximity sensor assembly of claim 11, wherein the first and second electrodes are configurable to generate a mutual capacitance to provide a first capacitive sensor and are further configurable to generate a self-capacitance to provide a second capacitive sensor.

13. The capacitive proximity sensor assembly of claim 12, wherein the first and second electrodes are shorted together and move towards the third electrode when the compliant first dielectric is compressed so as to form a third capacitive sensor that senses pressure.

14. The capacitive proximity sensor assembly of claim 13, wherein the third and fourth electrodes provide a fourth capacitive sensor, and wherein the controller sequentially samples signals associated with each of the first, second, third and fourth capacitance sensors.

15. The capacitive proximity sensor assembly of claim 10, wherein the assembly is located on a vehicle.

16. The capacitive proximity sensor assembly of claim 15, wherein the proximity sensor assembly is located on a steering wheel of the vehicle.

17. A capacitive proximity sensor assembly comprising:
first and second electrodes configurable to form a mutual capacitance;
a third electrode;
a first compliant dielectric disposed between both of the first and second electrodes and the third electrode; and
a controller selectively processing signals associated with the first, second, and third electrodes and selectively reconfiguring operation of the first, second and third electrodes in different proximity sensor arrangements to provide a plurality of capacitive sensors.

18. The capacitive proximity sensor assembly of claim 17, wherein the first electrode comprises a first plurality of capacitive fingers and the second electrode comprises a second plurality of electrode fingers, wherein the first plurality of electrode fingers are interdigitated with the second plurality of electrode fingers.

19. The capacitive proximity sensor assembly of claim 17 further comprising a fourth electrode, and a second compliant dielectric disposed between the third and fourth electrodes.

20. The capacitive proximity sensor assembly of claim 17, wherein the assembly is located on a vehicle.

* * * * *